United States Patent
Masuda et al.

(10) Patent No.: US 9,520,335 B2
(45) Date of Patent: Dec. 13, 2016

(54) WAVELENGTH SELECTIVE HEAT RADIATION MATERIAL SELECTIVELY RADIATING HEAT RADIATION LIGHT CORRESPONDING TO INFRARED RAY TRANSMISSION WAVELENGTH REGION OF RESIN MEMBER AND METHOD FOR MANUFACTURING THE SAME

(71) Applicants: Tokyo Metropolitan University, Tokyo (JP); Okitsumo Incorporated, Mie (JP)

(72) Inventors: Hideki Masuda, Tokyo (JP); Toshiaki Kondo, Tokyo (JP); Takashi Toyonaga, Mie (JP); Naoshi Kimura, Mie (JP); Fumitaka Yoshioka, Mie (JP)

(73) Assignees: TOKYO METROPOLITAN UNIVERSITY, Tokyo (JP); OKITSUMO INCORPORATED, Nabari-Shi, Mie (JP)

( * ) Notice: Subject to any disclaimer, the term of this patent is extended or adjusted under 35 U.S.C. 154(b) by 0 days.

(21) Appl. No.: 15/029,441

(22) PCT Filed: Apr. 2, 2015

(86) PCT No.: PCT/JP2015/060447
§ 371 (c)(1),
(2) Date: Apr. 14, 2016

(87) PCT Pub. No.: WO2015/190163
PCT Pub. Date: Dec. 17, 2015

(65) Prior Publication Data
US 2016/0260649 A1    Sep. 8, 2016

(30) Foreign Application Priority Data
Jun. 13, 2014 (JP) .................... 2014-122260

(51) Int. Cl.
*H01L 23/34* (2006.01)
*H01L 23/367* (2006.01)
(Continued)

(52) U.S. Cl.
CPC ......... *H01L 23/367* (2013.01); *C23C 14/0021* (2013.01); *C23C 14/042* (2013.01);
(Continued)

(58) Field of Classification Search
CPC ............... C23C 14/5846; C23C 14/205; C23C 14/5886; C23C 14/042; C23C 14/5873; C23C 14/34; C23C 14/0021; H01L 23/367; C25F 3/14; C25F 3/22
See application file for complete search history.

(56) References Cited

U.S. PATENT DOCUMENTS

2013/0213460 A1* 8/2013 Matsumoto ............ H01L 35/00
                                                                  136/253

FOREIGN PATENT DOCUMENTS

JP    4-305911 A    10/1992
JP    11-74162 A    3/1999
(Continued)

OTHER PUBLICATIONS

International Search Report dated Jun. 30, 2015 issued in corresponding PCT/JP2015/060447 application (pp. 1-2).
(Continued)

*Primary Examiner* — (Vikki) Hoa B Trinh
(74) *Attorney, Agent, or Firm* — Milen, White, Zelano, Branigan, P.C.

(57) ABSTRACT

An object is to provide a method for manufacturing a wavelength selective heat radiation material in which a surface roughness of an upper portion of a cavity wall defining each microcavity is suppressed or in which microcavities each having an aspect ratio larger than 3.0 are
(Continued)

formed. For the wavelength selective heat radiation material, a base material having a mask having predetermined openings tightly adhered to a surface thereof, or a base material in which depressions are previously formed on one surface thereof by pressing a die having projections arrayed so as to correspond to positions of microcavities thereagainst, is subjected to anisotropic etching, thereby providing a wavelength selective heat radiation material in which the surface roughness of the upper portion of the cavity wall defining each of the microcavities is suppressed or a wavelength selective heat radiation material having microcavities whose each aspect ratio is larger than 3.0.

20 Claims, 16 Drawing Sheets

(51) Int. Cl.
  *C25F 3/04* (2006.01)
  *C25F 3/14* (2006.01)
  *C25F 3/20* (2006.01)
  *C23F 1/20* (2006.01)
  *H01L 23/36* (2006.01)
  *H01L 23/373* (2006.01)
  *H05K 7/20* (2006.01)
  *C23C 14/00* (2006.01)
  *C23C 14/04* (2006.01)
  *C23C 14/20* (2006.01)
  *C23C 14/34* (2006.01)
  *C23C 14/58* (2006.01)
  *C25F 3/22* (2006.01)

(52) U.S. Cl.
  CPC ............ *C23C 14/205* (2013.01); *C23C 14/34* (2013.01); *C23C 14/5846* (2013.01); *C23C 14/5873* (2013.01); *C23C 14/5886* (2013.01); *C23F 1/20* (2013.01); *C25F 3/04* (2013.01); *C25F 3/14* (2013.01); *C25F 3/20* (2013.01); *C25F 3/22* (2013.01); *H01L 23/36* (2013.01); *H01L 23/373* (2013.01); *H05K 7/20* (2013.01); *H01L 2924/0002* (2013.01)

(56) References Cited

FOREIGN PATENT DOCUMENTS

| | | |
|---|---|---|
| JP | 2004-238230 A | 8/2004 |
| JP | 2010-027831 A | 2/2010 |
| JP | 2013-057101 A | 3/2013 |
| JP | 2014-33062 A | 2/2014 |

OTHER PUBLICATIONS

English Abstract of JP H 04-305911 A published Oct. 28, 1992.
English Abstract of JP H 11-74162 A published Mar. 16, 1999.
English Abstract of JP 2004-238230 A published Aug. 26, 2004.
English Abstract of JP 2010-027831 A published Feb. 4, 2010.
English Abstract of JP 2013-057101 A published Mar. 28, 2013.

* cited by examiner

RADIATION SPECTRUM

RADIATION SPECTRUM

WAVELENGTH SELECTIVE HEAT RADIATION MATERIAL SELECTIVELY RADIATING HEAT RADIATION LIGHT CORRESPONDING TO INFRARED RAY TRANSMISSION WAVELENGTH REGION OF RESIN MEMBER AND METHOD FOR MANUFACTURING THE SAME

TECHNICAL FIELD

The present invention relates to a wavelength selective heat radiation material which selectively radiates heat radiation light corresponding to an infrared ray transmission wavelength region of a resin member and to a method for manufacturing the wavelength selective heat radiation material, and in particular, the present invention relates to a method for manufacturing a wavelength selective heat radiation material which selectively radiates, at a high emissivity, heat radiation light corresponding to an infrared ray transmission wavelength region of a resin member from a heat radiation surface of the wavelength selective heat radiation material toward the resin member, by placing the wavelength selective heat radiation material between a heat generation source and the resin member in an electronic device in which the heat generation source is covered with the resin member having the infrared ray transmission wavelength region.

BACKGROUND ART

In recent years, in association with miniaturization and weight reduction, speeding-up, and multi-functionality of an electronic device, speeding-up and high integration of a semiconductor component have been promoted, and thus, a heat generation density of each element has increased and the local concentration of heat generation has been resulting. In addition, since a variety of resin materials are used in an electronic device-related component, due to the characteristic of the resin material that is the inferiority in heat conductivity, heat generated by the electronic device is caught by a cover or the like made of the resin and is accumulated, thereby leading to the problem in that the temperature increase causes a failure rate of the electronic device to be increased and the life of each component to be shortened.

Therefore, in order to solve the above-mentioned problem, as disclosed in Japanese Patent Application Laid-Open Publication No. 2010-27831 (Patent Literature 1) and Japanese Patent Application Laid-Open Publication No. 2014-33062 (Patent Literature 2), the present inventors et al. developed a method in which in an electronic device in which a heat generation source is covered with a resin member having an infrared ray transmission wavelength region, a wavelength selective heat radiation material in which a multitude of microcavities forming a periodic surface fine uneven pattern are two-dimensionally arrayed is placed between the heat generation source and the resin member, thereby enhancing an infrared ray transmitting property of the resin member with which the heat generation source is covered (providing the resin member with transparency) and improving a heat radiation efficiency of the electronic device; and a wavelength selective heat radiation material used to selectively radiating heat radiation light corresponding to the infrared ray transmission wavelength region of the resin member and a method for manufacturing the same.

In the wavelength selective heat radiation material disclosed in each of Patent Literature 1 and Patent Literature 2, an opening size of each of the microcavities is approximately several µm, and the microcavities are extremely fine depressions. Therefore, in Patent Literature 1, by combining semiconductor photolithography technology and an electrolytic etching method, the microcavities are formed in the wavelength selective heat radiation material, and in Patent Literature 2, by employing nanoimprint technology, a surface fine uneven pattern, periodically repeated in a plane formed on a die, is transcribed and molded to a metal material, thereby forming the microcavities in the wavelength selective heat radiation material.

However, in the conventional technology in which the semiconductor photolithography technology and the electrolytic etching method are combined, an upper portion of a cavity wall of each of the obtained microcavities is chipped or thin-walled, thereby leading to a problem in that it is impossible to selectively radiate the heat radiation light corresponding to the infrared ray transmission wavelength region of the resin member at the emissivity as originally designed. In addition, with respect to the chipping or thin-walling of the upper portion of the cavity wall, there also is a problem in that any finding on what influence to be exerted on the radiation characteristic of the heat radiation light corresponding to the infrared ray transmission wavelength region of the resin member has not been obtained.

In the wavelength selective heat radiation material disclosed in each of Patent Literature 1 and Patent Literature 2, it is preferable that an aspect ratio of each of the microcavities is in a range of 0.8 to 3.0. This is because if the aspect ratio of each of the microcavities is below 0.8, a disadvantage in that a selective radiant intensity is reduced is caused, and on the other hand, if the aspect ratio is above 3.0, a disadvantage in that the formation of the microcavities is extremely difficult is caused.

However, in the conventional technology in which the semiconductor photolithography technology and the electrolytic etching method are combined or the nanoimprint lithography, there is a problem in that it is difficult to form microcavities each having an aspect ratio larger than 3.0 without roughening the upper portion of the cavity wall. Therefore, as the wavelength selective heat radiation material which selectively radiates the heat radiation light corresponding to the infrared ray transmission wavelength region of the resin member, a wavelength selective heat radiation material in which the microcavities each having the aspect ratio larger than 3.0 has not been known. In addition, there also is a problem in that any finding on what emissivity at which the wavelength selective heat radiation material, if the aspect ratio of each of the microcavities is larger than 3.0, is capable of selectively radiating the heat radiation light corresponding to the infrared ray transmission wavelength region of the resin member has not been obtained.

CITATION LIST

Patent Literature

[Patent Literature 1] Japanese Patent Application Laid-Open Publication No. 2010-27831
[Patent Literature 2] Japanese Patent Application Laid-Open Publication No. 2014-33062
[Patent Literature 3] Japanese Patent Application Laid-Open Publication No. 11-74162

[Patent Literature 4] Japanese Patent Application Laid-Open Publication No. 2013-57101

SUMMARY OF THE INVENTION

Technical Problem

Therefore, objects of the present invention are to provide a method for manufacturing, as a wavelength selective heat radiation material which selectively radiates heat radiation light corresponding to an infrared ray transmission wavelength region of a resin member, a wavelength selective heat radiation material in which a surface roughness of an upper portion of a cavity wall defining each microcavity (a size of a chipped portion or a thin-walled portion of the upper portion of the cavity wall) is suppressed or a wavelength selective heat radiation material in which microcavities each having an aspect ratio larger than 3.0 are formed; and a wavelength selective heat radiation material having a form of each of the microcavities, which are effective for selectively radiating the heat radiation light corresponding to the infrared ray transmission wavelength region of the resin member, by investigating heat radiation characteristics of the obtained wavelength selective heat radiation material.

Solution to Problem

The present inventors et al. have made intensive studies on a method for manufacturing a wavelength selective heat radiation material which selectively radiates heat radiation light corresponding to an infrared ray transmission wavelength region of a resin member. As a result, the present inventors et al. have found that a base material to whose one surface a mask having predetermined openings is previously caused to tightly adhere or a base material in which depressions are previously formed on the one surface thereof by pressing a die having projections arrayed so as to correspond to positions of microcavities thereagainst is subjected to anisotropic etching, thereby allowing a wavelength selective heat radiation material in which a surface roughness of an upper portion of a cavity wall defining each of the microcavities is suppressed or a wavelength selective heat radiation material having an aspect ratio of each of the microcavities larger than 3.0 to be obtained.

In addition, by investigating characteristics of the obtained wavelength selective heat radiation material, the present inventors et al. have found the form of each of the microcavities which are effective for selectively radiating the heat radiation light corresponding to the infrared ray transmission wavelength region of the resin member (an opening ratio, an aspect ratio, and a surface roughness of an upper portion of a cavity wall), thereby reaching the completion of the present invention.

Specifically, according to the present invention, by employing a first method for manufacturing a wavelength selective heat radiation material, the method including the steps of: (a) placing a mask having predetermined openings on one surface of a base material and causing the mask to tightly adhere to the one surface; (b) etching the base material at the openings of the mask and forming microcavities in the base material; and (c) exfoliating the mask from the base material, provided is a wavelength selective heat radiation material for selectively radiating heat radiation light corresponding to an infrared ray transmission wavelength region of a resin member, the wavelength selective heat radiation material having a heat radiation surface, the heat radiation surface having a multitude of microcavities formed therein, the microcavities having rectangular openings being periodically repeated and being two-dimensionally arrayed in a grating-like manner, and the microcavities each having an opening ratio a/Λ (a: opening size, Λ: opening period) in a range of 0.5 to 0.9 and each having 1 µm or less of a surface roughness Rz (a size of a chipped portion or a thin-walled portion of an upper portion of a cavity wall) of the upper portion of the cavity wall each defining the microcavities.

In addition, according to the present invention, also by employing a second method for manufacturing a wavelength selective heat radiation material, the method including the steps of: (a) forming depressions in one surface of a base material by pressing a die having projections against the one surface, the projections being arrayed so as to correspond to positions of microcavities; and (b) forming the microcavities in the base material by etching the base material, provided is a wavelength selective heat radiation material for selectively radiating heat radiation light corresponding to an infrared ray transmission wavelength region of a resin member, the wavelength selective heat radiation material having a heat radiation surface, the heat radiation surface having a multitude of microcavities formed therein, the microcavities having rectangular openings being periodically repeated and being two-dimensionally arrayed in a grating-like manner, and the microcavities each having an opening ratio a/Λ (a: opening size, Λ: opening period) in a range of 0.5 to 0.9 and each having 1 µm or less of a surface roughness Rz (a size of a chipped portion or a thin-walled portion of an upper portion of a cavity wall) of the upper portion of the cavity wall each defining the microcavities.

It is to be noted that as shown in FIG. 11 and FIG. 13, the surface roughness Rz of the upper portion of the cavity wall denotes a depth of a chipped portion of the cavity wall from an upper surface of each of the microcavities in the upper portion of the cavity wall each defining the microcavities or a length of a portion, which is thinner than an originally planned thickness of the cavity wall, from the upper surface of each of the microcavities.

The wavelength selective heat radiation material according to the present invention is applicable to a wavelength selective heat radiation material which in an electronic device or the like whose heat generation source is covered with a resin member having an infrared ray transmission wavelength region, is placed between the heat generation source and the resin member so as to cover said heat generation source; to which heat energy from the heat generation source is transferred or inputted by heat radiation; and which selectively radiates heat radiation light included in the infrared ray transmission wavelength region of the resin member from a heat radiation surface of the wavelength selective heat radiation material toward the resin member.

In particular, in a case where the aspect ratio d/a (d: opening depth, a: opening size) of each of the microcavities is 3.3 or more, the wavelength selective heat radiation material according to the present invention exhibits a high emissivity, which is 0.85 or more, with respect to the heat radiation light corresponding to the infrared ray transmission wavelength region of the resin member. Therefore, the wavelength selective heat radiation material according to the present invention is beneficial for enhancing a heat radiation efficiency of the heat generation source covered with the resin member having the infrared ray transmission wavelength region.

In the wavelength selective heat radiation material according to the present invention, as indicated by the simulation test shown in FIG. 12, when the surface roughness Rz of the upper portion of the cavity wall each defining the microcavities becomes larger than 1 μm, a peak of a spectral emissivity in a wavelength range of 4.75 to 5.75 μm in particular is reduced. In addition, when the surface roughness Rz of the upper portion of the cavity wall becomes larger than 1 μm, regardless of a depth d of an opening of each of the microcavities, a spectral emissivity in a wavelength range of 1 to 10 μm is reduced, and a peak of a spectral emissivity in a wavelength range of 3 to 5.5 μm in particular is reduced. Therefore, it is made difficult to selectively radiate the heat radiation light included in the infrared ray transmission wavelength region of the resin member.

In the present invention, it is preferable that the opening ratio of each of the microcavities formed in the heat radiation surface of the wavelength selective heat radiation material is in a range of 0.5 to 0.9.

This is because when the opening ratio of each of the microcavities is less than 0.5, brought about is a disadvantage in that selectivity for the heat radiation light corresponding to the infrared ray transmission wavelength region of the resin member is reduced; and conversely, when the opening ratio is above 0.9, brought about is a disadvantage in that structure stability of a fine structure is reduced.

In addition, it is preferable that the aspect ratio d/a (d: opening depth, a: opening size) of each of the microcavities formed in the heat radiation surface of the wavelength selective heat radiation material is 3.3 or more.

This is because in a region in which the aspect ratio d/a of each of the microcavities is less than 3.3, in accordance with an increase in the aspect ratio d/a, an emissivity of the heat radiation light corresponding to the infrared ray transmission wavelength region of the resin member is sharply increased up to approximately 0.85, whereas in a region in which the aspect ratio d/a is 3.3 or more, with respect to a rate of an increase in the aspect ratio d/a, a rate of an increase in the emissivity of heat radiation light corresponding to the infrared ray transmission wavelength region of the resin member is sharply decreased and nearly levels off in a range of 0.85 to 1.0.

As described above, in order to maximize the heat radiation efficiency of the heat generation source, it is preferable that the wavelength selective heat radiation material according to the present invention is placed between the heat generation source and the resin member so as to cover said heat generation source. Furthermore, it is preferable that as the heat radiation light included in the infrared ray transmission wavelength region of the resin member, infrared light which exerts great influence on heat transfer is targeted.

In the heat radiation surface of the wavelength selective heat radiation material according to the present invention, the multitude of microcavities whose surface have been textured (surface texturing) are present. It is preferable that each of these microcavities is opened in a rectangular shape or a circular shape so as to have a predetermined opening ratio and a predetermined aspect ratio; and each of the microcavities is formed at the substantially same period as a period of a wavelength in the infrared ray transmission wavelength region of the resin member covering the heat generation source or at a period being shorter by 1 μm than the period of the wavelength in the infrared ray transmission wavelength region of the resin member covering the heat generation source.

The reason is that when the period at which each of the microcavities is formed is made the substantially same period of the wavelength of the infrared ray transmission wavelength region of the resin member covering the heat generation source, surface plasmon resonance occurs in the periodic structure and an electromagnetic field of the heat radiation light, and therefore, the emissivity in the infrared ray transmission wavelength region of the resin member is increased (resonance effect).

In addition, the reason is that when the period at which each of the microcavities is formed is made the period being shorter by 1 μm than the period of the wavelength in the infrared ray transmission wavelength region of the resin member covering the heat generation source, a wavelength of a mode having the strongest intensity among the electromagnetic waves confined within the microcavities and the wavelength of the infrared ray transmission wavelength region of the resin member can coincide with each other, and as a result, an emissivity in the infrared ray transmission wavelength region of the resin member is increased (cavity effect).

It is preferable that the microcavities are arrayed in a grating-like manner in a radiation surface in a plane view. This is because the grating-like array efficiently increases an emissivity of heat energy rays. It is to be noted that the present invention is not limited to the grating-like array only, but other array such as an array having a honeycomb structure may be adopted.

In addition, it is preferable that the wavelength selective heat radiation material in which the microcavities are formed is formed of a metal material whose emissivity in an infrared region of a wavelength of 1 to 10 μm is 0.4 or less. This is because when the emissivity in the infrared region exceeds 0.4, a disadvantage in that selective radiation characteristics are reduced is brought about.

In addition, it is preferable that a period at which each of the microcavities is arrayed is 4 to 7 μm and only the infrared light in the infrared ray transmission wavelength region of the resin member covering the heat generation source can be selectively radiated. This is because although an absorption wavelength region and a transmission wavelength region of the infrared light are slightly different from each other, depending on a kind of resin, it is often the case that most of the resin materials currently used as a material for an electronic device indicate the above-mentioned wavelength region.

Therefore, it is preferable that the wavelength selective heat radiation material according to the present invention is placed between the heat generation source and the resin member covering said heat generation source.

As described above, the base material to whose one surface the mask having the predetermined openings is previously caused to tightly adhere or the base material in which the depressions are previously formed on the one surface thereof by pressing the die having the projections arrayed so as to correspond to the positions of microcavities thereagainst is subjected to the anisotropic etching, thereby allowing the wavelength selective heat radiation material according to the present invention to be manufactured.

In the manufacturing of the wavelength selective heat radiation material according to the present invention, when the anisotropic etching process is conducted by employing an electrochemical etching method or a chemical etching method, the etching is started preferentially from the openings of the mask or the depressions, thereby allowing the formation of etching pits, whose etching starting positions are controlled at a high precision, to be realized. As a result, the wavelength selective heat radiation material in which the high precision microcavities whose surface roughness Rz of the upper portion of the cavity wall defining each of the microcavities is suppressed to be 1 μm or less or the microcavities each having an aspect ratio larger than 3.0 whose surface expansion efficiency is high are formed can be easily obtained.

In addition, in the above-mentioned anisotropic etching process, it is preferable that the base material used for manufacturing the wavelength selective heat radiation material is constituted of a metal foil of aluminum or an aluminum alloy whose area occupancy ratio of a (100) crystal plane is 93% or more. In order to obtain a large (100) crystal plane, it is advantageous to use a metal foil constituted of aluminum or an aluminum alloy which has been subjected to an annealing process.

When the metal foil whose (100) crystal plane is oriented preferentially with respect to a surface and which is constituted of the aluminum or the aluminum alloy whose area occupancy ratio is 93% or more is used, the microcavities oriented perpendicularly to the heat radiation surface can be easily obtained.

In the above-mentioned anisotropic etching process, in the case where the mask having the predetermined openings is previously caused to tightly adhere to the one surface of the base material, it is preferable that said mask is constituted of a flexible polymer. Having the flexibility facilitates the adhesion and exfoliation operations for the mask, thereby facilitating the manufacturing of a desired wavelength selective heat radiation material.

In the case where the mask is constituted of the polymer, although a material of the mask is not particularly limited, a polycarbonate, polypropylene, polyethersulfone, polyamide, cellulose acetate, triacetylcellulose, polytetrafluoroethylene, an epoxy-based polymer, or the like may be used.

In addition, it is preferable that the mask is caused to tightly adhere to the metal foil by exerting a load thereon from the surface. In consideration of adhesiveness of the mask and the prevention of damage to the base material, it is preferable that the load exerted on the mask is in a range of $10^4$ to $10^6$ Pa.

By exerting the load on the mask, the mask is caused to tightly adhere to the metal foil surface, thereby allowing a desired tight adhesion state to be more accurately obtained. By causing the mask to accurately adhere tightly to the foil surface, an unnecessary etching liquid or the like comes not to enter between the mask surface and the foil surface, thereby allowing desired etching to be more precisely and accurately conducted through the openings of the mask.

More specifically, by using a stamp having a semi-cylindrical-shaped pressing surface and performing pressing and swinging, the mask can be transcribed. In addition, it is preferable that the pressing surface of the semi-cylindrical-shaped stamp has a curvature of 0.01 to 0.2.

The pressing surface of the stamp has the semi-cylindrical-shaped curvature, and thus, it can be prevented that entering of air between the metal foil in which the microcavities are formed and the mask or between the metal foil and the stamp upon the transcription of the mask hinders the transcription of the pattern. In addition, when the pressing surface of the stamp has the semi-cylindrical-shaped curvature, the load exerted on the mask can also be reduced.

Furthermore, in the anisotropic etching process, in the case where the mask having the predetermined openings is previously caused to tightly adhere to the one surface of the base material, it is preferable that prior to the etching, a thin film of copper having a thickness of 5 to 20 nm is formed on an upper surface of the mask by evaporation or sputtering, since the formation of uniform microcavities is promoted.

In the above-mentioned anisotropic etching process, it is preferable that the metal foil is subjected to a chemical polishing process or an electrolytic polishing process, prior to causing the mask having the predetermined openings to tightly adhere to the one surface of the metal foil in the case where the mask having the predetermined openings is previously caused to tightly adhere to the one surface of the metal foil or prior to forming the depressions in the one surface of the metal foil in the case where by pressing the die having the projections arrayed so as to correspond to the positions of microcavities thereagainst, the depressions are previously formed on the one surface of the metal foil.

On the surface of the metal foil constituted of the aluminum or the aluminum alloy, in the manufacturing processes including the annealing process, an ununiform oxide film layer, dirt, flaws, and the like are present. Therefore, by removing these through the polishing process, the oxide film layer or the like formed on the surface of the metal foil is uniformized and homogenized. As a result of this, selectivity with respect to the starting of the etching from the depressions is enhanced, thereby making it possible to realize enhancement in a precision at which a starting point of the etching is controlled.

In addition, in a case where the polishing process is the electrolytic polishing process, by using, for example, a mixed solution of perchloric acid and ethanol, the electrolytic polishing can be conducted.

The anisotropic etching process used for forming the microcavities can be conducted by employing either of the electrochemical etching method or the chemical etching method. However, in particular, the electrolytic etching allows the microcavities to be formed at an excellent precision without using complex equipment. Therefore, the electrolytic etching is suitable for manufacturing the wavelength selective heat radiation material according to the present invention. The electrolytic etching can be conducted, for example, by using a 5M to 7M hydrochloric acid aqueous solution and at a temperature of 25° C. to 45° C. or more.

In addition, in the electrolytic etching process, in the case where the mask having the predetermined openings is previously caused to tightly adhere to the one surface of the metal foil, it is preferable that a small amount of a surfactant, any of alcohols, or the like, as a component which allows wettability of the mask to be improved, is added to an electrolysis liquid, in order to allow the electrolysis liquid in the electrolytic etching to quickly infiltrate into fine pores of the mask and of a support or the like of the mask, which is placed continuously with the mask.

When the electrolysis liquid to which the small amount of the surfactant, any of alcohols, or the like is added is used, since the metal foil is electrolytically etched through the openings of the mask, the metal foil in which the microcavities are formed at an excellent precision can be manufactured.

As specific conditions under which the electrolytic etching is conducted, it is preferable that an electrolytic bath whose bath composition is a 5M to 7M hydrochloric acid aqueous solution and whose bath temperature is 25° C. to 45° C. is used; a current density upon starting electrolysis is 1500 mA/cm$^2$; and after decreasing the current density at a current density decrease rate of 150 mA/cm$^2$/s up to 200 mA/cm$^2$, the current density of 200 mA/cm$^2$ is retained for 5 to 40 seconds, and it is more preferable that the bath temperature in the electrolytic etching is 30° C. to 40° C. and a retention time at the current density of 200 mA/cm$^2$ is 5 to 15 seconds.

According to the present invention, the base material to whose one surface the mask having the predetermined openings is previously caused to tightly adhere or the base material in which the depressions are previously formed on the one surface thereof by pressing the die having the projections arrayed so as to correspond to the positions of microcavities thereagainst is subjected to the anisotropic etching. Thus, it is made possible to obtain the wavelength selective heat radiation material whose surface roughness (the size of the chipped portion or the thin-walled portion of the upper portion of the cavity wall) of the upper portion of the cavity wall defining each of the microcavities is suppressed and whose aspect ratio of each of the microcavities is larger than 3.0.

In addition, according to the present invention, the method for manufacturing the wavelength selective heat radiation material, which includes the step of previously transcribing the mask on the one surface of the base material by using the stamp having the semi-cylindrical-shaped pressing surface, can be provided. Thus, it can be prevented that upon the transcribing for the mask, entering of air between the metal foil and the mask hinders the transcription of the pattern. In addition, since adhesiveness of the mask is enhanced, the unnecessary etching liquid or the like is prevented from entering between the surface of the mask and the surface of the metal foil, thereby allowing the desired etching to be more precisely and accurately conducted through the openings of the mask.

DESCRIPTION OF THE PREFERRED EMBODIMENTS

Hereinafter, with reference to Examples and Comparative Examples, a preferred embodiment of the present invention will be described. It is to be noted that the present invention is not limited to Examples described below and a variety of modifications within the scope not departing from the technical ideas of the present invention are possible.

Example 1

Figure 1:
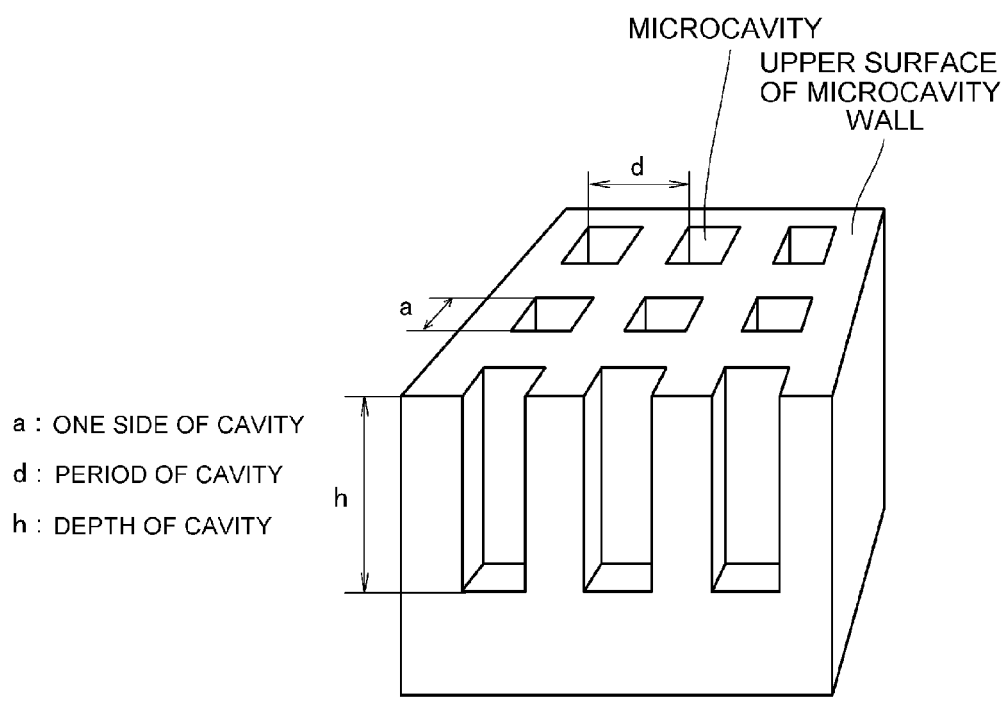
FIG. 1 is a schematic diagram illustrating microcavities formed in a wavelength selective heat radiation material according to the present invention.
Figure 2:
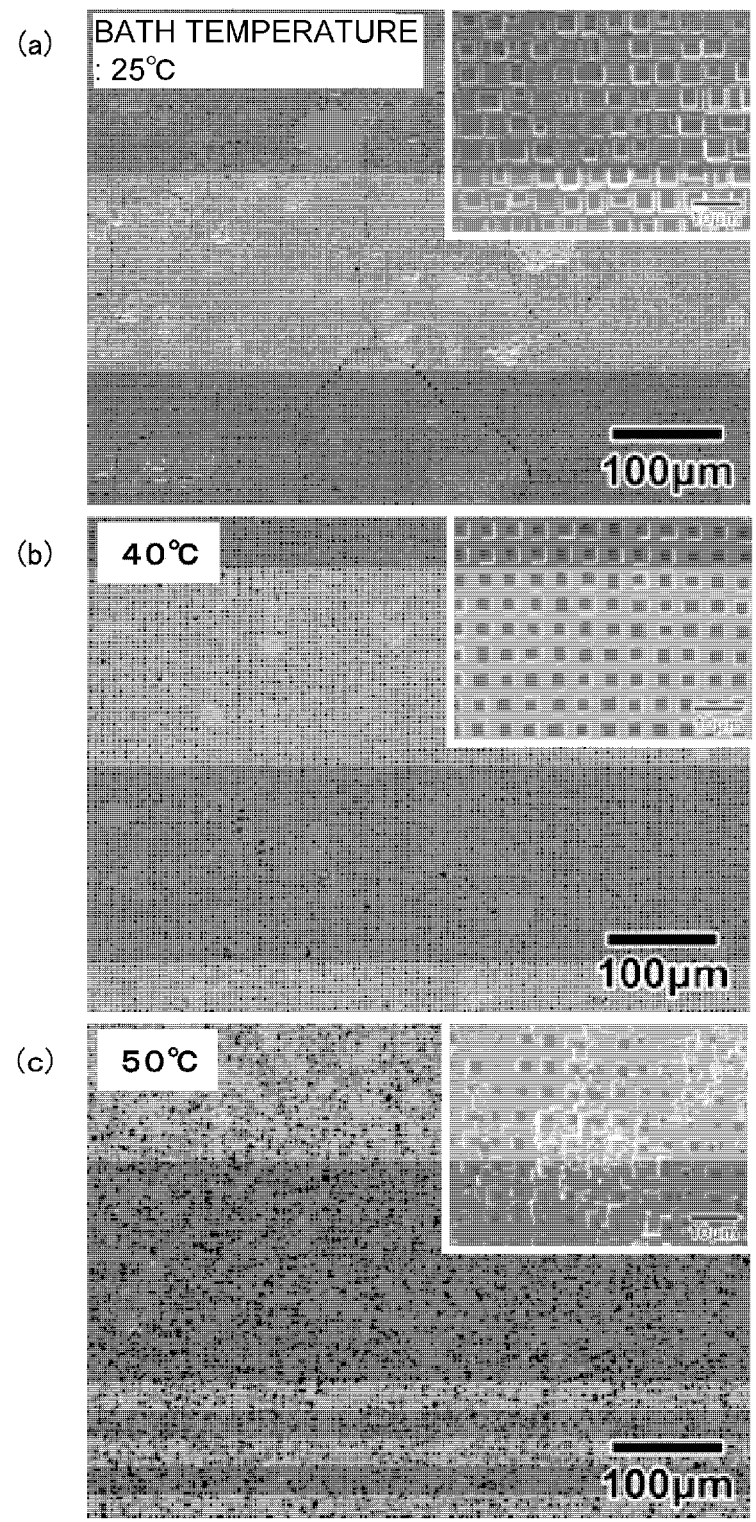
FIG. 2 shows electron microscope photographs of the wavelength selective heat radiation material obtained by changing a bath temperature of an electrolytic bath in a method according to the present invention for manufacturing the wavelength selective heat radiation material.

An aluminum foil whose area occupancy ratio of a (100) crystal plane of a surface was 93% or more was used, said aluminum foil was subjected to electrolytic polishing by using a perchloric acid/ethanol bath, and thereafter, a neoprene thin film layer having a structure in which fine pores each having a size of 2 μm were regularly arrayed at intervals of 5 μm was caused to tightly adhere to the surface thereof for formation. Copper was attached to said aluminum foil by conducting a sputtering process; thereafter, by using an electrolytic bath having a bath temperature of 25° C. and containing a 7M hydrochloric acid aqueous solution, electrolytic etching to the resultant was conducted under the conditions that a current density upon starting electrolysis was 1500 mA/cm$^2$ and after decreasing the current density at a current density decrease rate of 150 mA/cm$^2$/s up to 200 mA/cm², the current density of 200 mA/cm² was retained for 15 seconds. Thereafter, the resultant was immersed in a 1 wt % aqueous solution of a sodium hydroxide; ultrasonic cleaning was conducted for 1 minute and 30 seconds; and the neoprene thin film layer was thereby removed, thereby obtaining a wavelength selective heat radiation material in which microcavities each having a length a of one side of 3 μm and an opening ratio a/Λ (a: opening size, Λ: opening period) of 0.6 were formed. An electron microscope photograph of a heat radiation surface of the obtained wavelength selective heat radiation material is shown in FIG. 2A.

Example 2

Under the same conditions as in Example 1, except that the bath temperature of the electrolytic bath was 30° C., electrolytic etching was conducted, thereby obtaining a wavelength selective heat radiation material in which microcavities each having a length a of one side of 3 μm and an opening ratio a/Λ (a: opening size, Λ: opening period) of 0.6 were formed.

Example 3

Under the same conditions as in Example 1, except that the bath temperature of the electrolytic bath was 35° C., electrolytic etching was conducted, thereby obtaining a wavelength selective heat radiation material in which microcavities each having a length a of one side of 3 μm and an opening ratio a/Λ (a: opening size, Λ: opening period) of 0.6 were formed.

Example 4

Under the same conditions as in Example 1, except that the bath temperature of the electrolytic bath was 40° C., electrolytic etching was conducted, thereby obtaining a wavelength selective heat radiation material in which microcavities each having a length a of one side of 3 μm and an opening ratio a/Λ (a: opening size, Λ: opening period) of 0.6 were formed. An electron microscope photograph of a heat radiation surface of the obtained wavelength selective heat radiation material is shown in FIG. 2B.

Example 5

Under the same conditions as in Example 1, except that the bath temperature of the electrolytic bath was 45° C., electrolytic etching was conducted, thereby obtaining a wavelength selective heat radiation material in which microcavities each having a length a of one side of 3 μm and an opening ratio a/Λ (a: opening size, Λ: opening period) of 0.6 were formed.

Example 6

Under the same conditions as in Example 1, except that the bath temperature of the electrolytic bath was 50° C., electrolytic etching was conducted, thereby obtaining a wavelength selective heat radiation material in which microcavities each having a length a of one side of 3 μm and an opening ratio a/Λ (a: opening size, Λ: opening period) of 0.6 were formed. An electron microscope photograph of a heat radiation surface of the obtained wavelength selective heat radiation material is shown in FIG. 2C.

Figure 3:
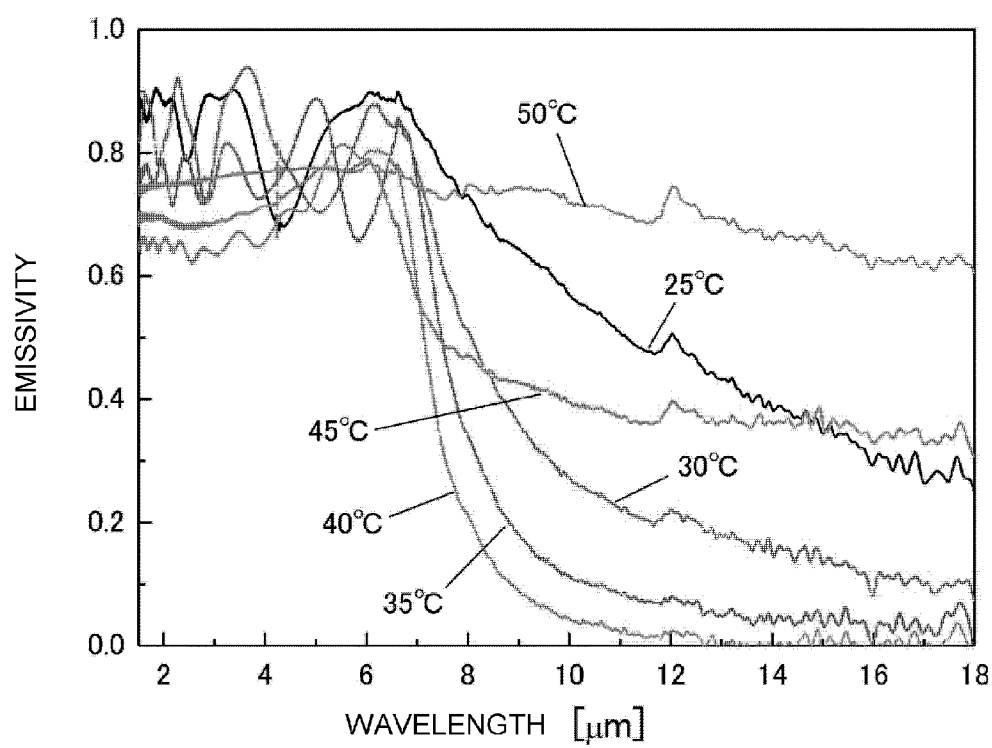
FIG. 3 is a characteristic curve graph showing a relationship between a wavelength and a spectral emissivity of the wavelength selective heat radiation material obtained by changing the bath temperature of the electrolytic bath in the method according to the present invention for manufacturing the wavelength selective heat radiation material.

A relationship between a wavelength and a spectral emissivity of each of the wavelength selective heat radiation materials in Example 1 to Example 6, obtained by conducting the measurements using a Fourier transform infrared spectrophotometer (FT/IR-4100, manufactured by JASCO) and a regular reflection unit (RF-81S, manufactured by JASCO), is shown in FIG. 3. The measurements were conducted under the conditions that a detector was TGS, a resolution was 4 cm$^{-1}$, a number of times of integration was 32, and a measurement band was 550 cm$^{-1}$ to 7800 cm$^{-1}$.

It was found out from FIG. 3 that in the method for manufacturing the wavelength selective heat radiation material according to the present invention, when preferably, the bath temperature of the electrolytic bath was in a range of 25° C. to 45° C. and more preferably, was in a range of 30° C. to 40° C., the wavelength selective heat radiation material having excellent wavelength selectivity in a wavelength range of 7 μm or less was obtained.

Example 7

Figure 4:
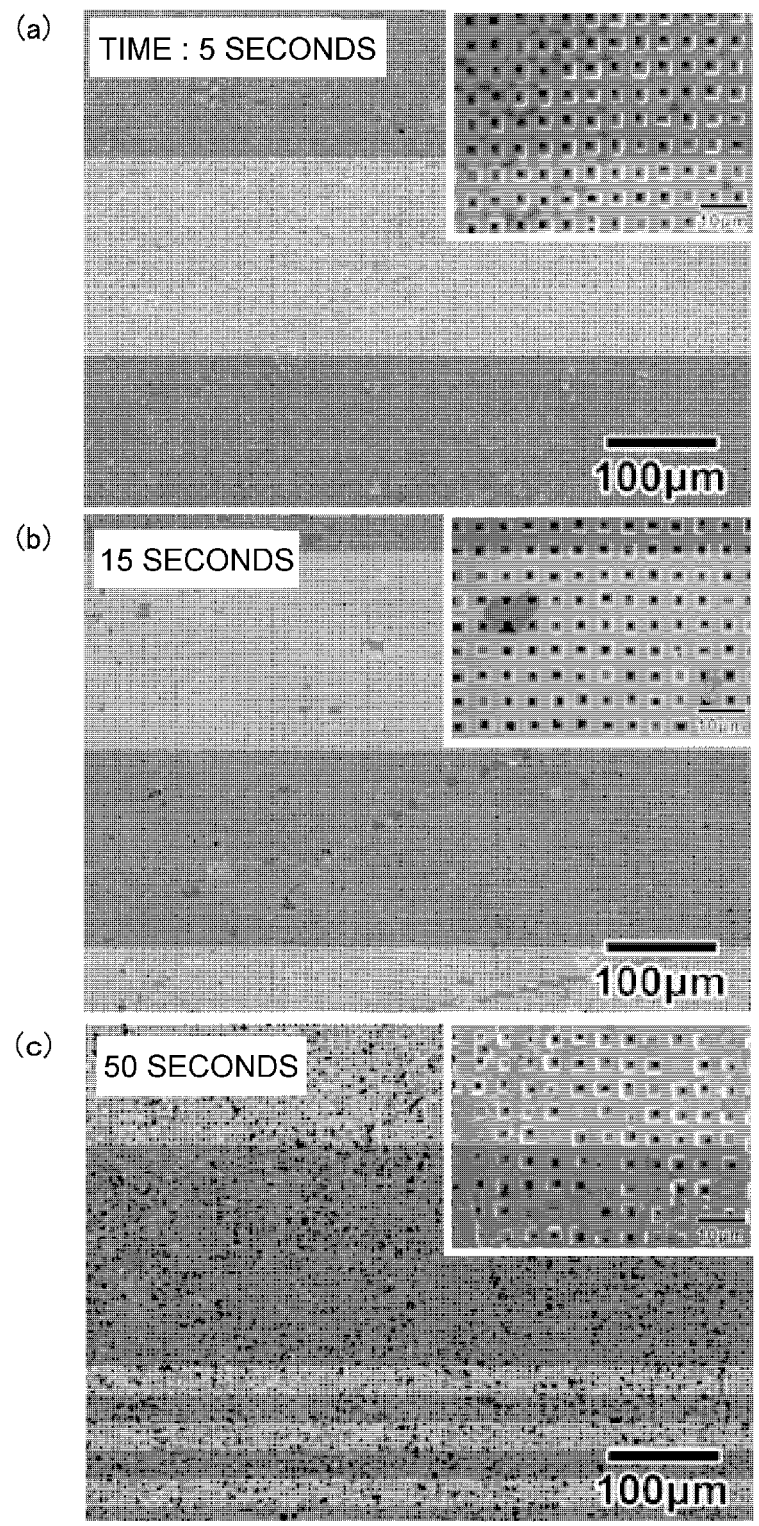
FIG. 4 shows electron microscope photographs of a wavelength selective heat radiation material obtained by changing an electrolysis time in the method according to the present invention for manufacturing the wavelength selective heat radiation material.

An aluminum foil whose area occupancy ratio of a (100) crystal plane of a surface was 93% or more was used, said aluminum foil was subjected to electrolytic polishing by using a perchloric acid/ethanol bath, and thereafter, a neoprene thin film layer having a structure in which fine pores each having a size of 2 μm were regularly arrayed at intervals of 5 μm was caused to tightly adhere to the surface thereof for formation. Copper was attached to said aluminum foil by conducting a sputtering process; thereafter, by using an electrolytic bath having a bath temperature of 40° C. and containing a 7M hydrochloric acid aqueous solution, electrolytic etching to the resultant was conducted under the conditions that a current density upon starting electrolysis was 1500 mA/cm² and after decreasing the current density at a current density decrease rate of 150 mA/cm²/s up to 200 mA/cm², the current density of 200 mA/cm² was retained for 5 seconds. Thereafter, the resultant was immersed in a 1 wt % aqueous solution of a sodium hydroxide; ultrasonic cleaning was conducted for 1 minute and 30 seconds; and the neoprene thin film layer was thereby removed, thereby obtaining a wavelength selective heat radiation material in which microcavities each having a length a of one side of 3 μm and an opening ratio a/Λ (a: opening size, Λ: opening period) of 0.6 were formed. An electron microscope photograph of a heat radiation surface of the obtained wavelength selective heat radiation material is shown in FIG. 4A.

Example 8

Under the same conditions as in Example 7, except that the retention time at the current density of 200 mA/cm² was 10 seconds, electrolytic etching was conducted, thereby obtaining a wavelength selective heat radiation material in which microcavities each having a length a of one side of 3 μm and an opening ratio a/Λ (a: opening size, Λ: opening period) of 0.6 were formed.

Example 9

Under the same conditions as in Example 7, except that the retention time at the current density of 200 mA/cm² was 15 seconds, electrolytic etching was conducted, thereby obtaining a wavelength selective heat radiation material in which microcavities each having a length a of one side of 3 μm and an opening ratio a/Λ (a: opening size, Λ: opening period) of 0.6 were formed. An electron microscope photograph of a heat radiation surface of the obtained wavelength selective heat radiation material is shown in FIG. 4B.

Example 10

Under the same conditions as in Example 7, except that the retention time at the current density of 200 mA/cm² was 20 seconds, electrolytic etching was conducted, thereby obtaining a wavelength selective heat radiation material in which microcavities each having a length a of one side of 3 μm and an opening ratio a/Λ (a: opening size, Λ: opening period) of 0.6 were formed.

Example 11

Under the same conditions as in Example 7, except that the retention time at the current density of 200 mA/cm² was 30 seconds, electrolytic etching was conducted, thereby obtaining a wavelength selective heat radiation material in which microcavities each having a length a of one side of 3 μm and an opening ratio a/Λ (a: opening size, Λ: opening period) of 0.6 were formed.

Example 12

Under the same conditions as in Example 7, except that the retention time at the current density of 200 mA/cm$^2$ was 40 seconds, electrolytic etching was conducted, thereby obtaining a wavelength selective heat radiation material in which microcavities each having a length a of one side of 3 µm and an opening ratio a/Λ (a: opening size, Λ: opening period) of 0.6 were formed.

Example 13

Under the same conditions as in Example 7, except that the retention time at the current density of 200 mA/cm$^2$ was 50 seconds, electrolytic etching was conducted, thereby obtaining a wavelength selective heat radiation material in which microcavities each having a length a of one side of 3 µm and an opening ratio a/Λ (a: opening size, Λ: opening period) of 0.6 were formed. An electron microscope photograph of a heat radiation surface of the obtained wavelength selective heat radiation material is shown in FIG. 4C.

Figure 5:
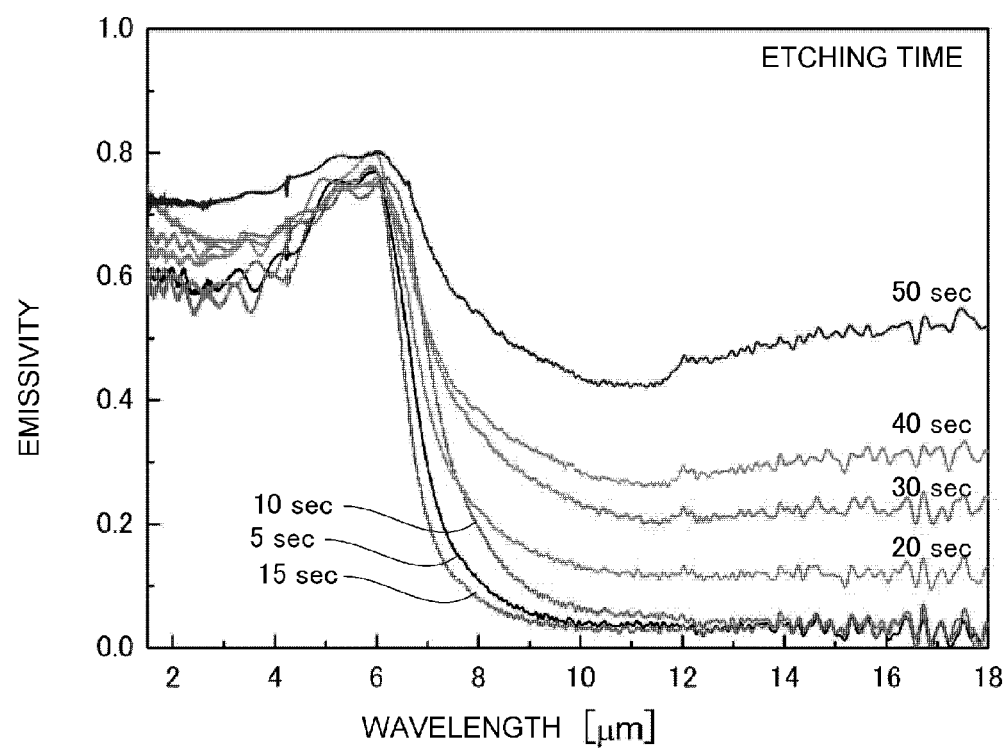
FIG. 5 is a characteristic curve graph showing a relationship between a wavelength and a spectral emissivity of the wavelength selective heat radiation material obtained by changing the electrolysis time in the method according to the present invention for manufacturing the wavelength selective heat radiation material.

A relationship between a wavelength and a spectral emissivity of each of the wavelength selective heat radiation materials in Example 7 to Example 13, obtained by conducting the measurements using a Fourier transform infrared spectrophotometer (FT/IR-4100, manufactured by JASCO) and a regular reflection unit (RF-81S, manufactured by JASCO), is shown in FIG. 5. The measurements were conducted under the conditions that a detector was TGS, a resolution was 4 cm$^{-1}$, a number of times of integration was 32, and a measurement band was 550 cm$^{-1}$ to 7800 cm$^{-1}$.

It was found out from FIG. 5 that in the method for manufacturing the wavelength selective heat radiation material according to the present invention, when preferably, the retention time at the current density of 200 mA/cm$^2$ was in a range of 5 to 40 seconds and more preferably, was in a range of 5 to 15 seconds, the wavelength selective heat radiation material having excellent wavelength selectivity in a wavelength range of 7 µm or more was obtained.

In view of the results of Example 1 to 13, under the below-described electrolysis conditions considered to be optimal, a wavelength selective heat radiation material in Example 14 was prepared.

Example 14

An aluminum foil whose area occupancy ratio of a (100) crystal plane of a surface was 93% or more was used, said aluminum foil was subjected to electrolytic polishing by using a perchloric acid/ethanol bath, and thereafter, a neoprene thin film layer having a structure in which fine pores each having a size of 2 µm were regularly arrayed at intervals of 5 µm was caused to tightly adhere to the surface thereof for formation. Copper was attached to said aluminum foil by conducting a sputtering process; thereafter, by using an electrolytic bath having a bath temperature of 40° C. and containing a 7M hydrochloric acid aqueous solution, electrolytic etching to the resultant was conducted under the conditions that a current density upon starting electrolysis was 1500 mA/cm$^2$ and after decreasing the current density at a current density decrease rate of 150 mA/cm$^2$/s up to 200 mA/cm$^2$, the current density of 200 mA/cm$^2$ was retained for 15 seconds. Thereafter, the resultant was immersed in a 1 wt % aqueous solution of a sodium hydroxide; ultrasonic cleaning was conducted for 1 minute and 30 seconds; and the neoprene thin film layer was thereby removed, thereby preparing the wavelength selective heat radiation material in which microcavities each having a length a of one side of 3 µm, an opening ratio a/Λ (a: opening size, Λ: opening period) of 0.6, and an aspect ratio of 16/3 were formed.

Figure 6:
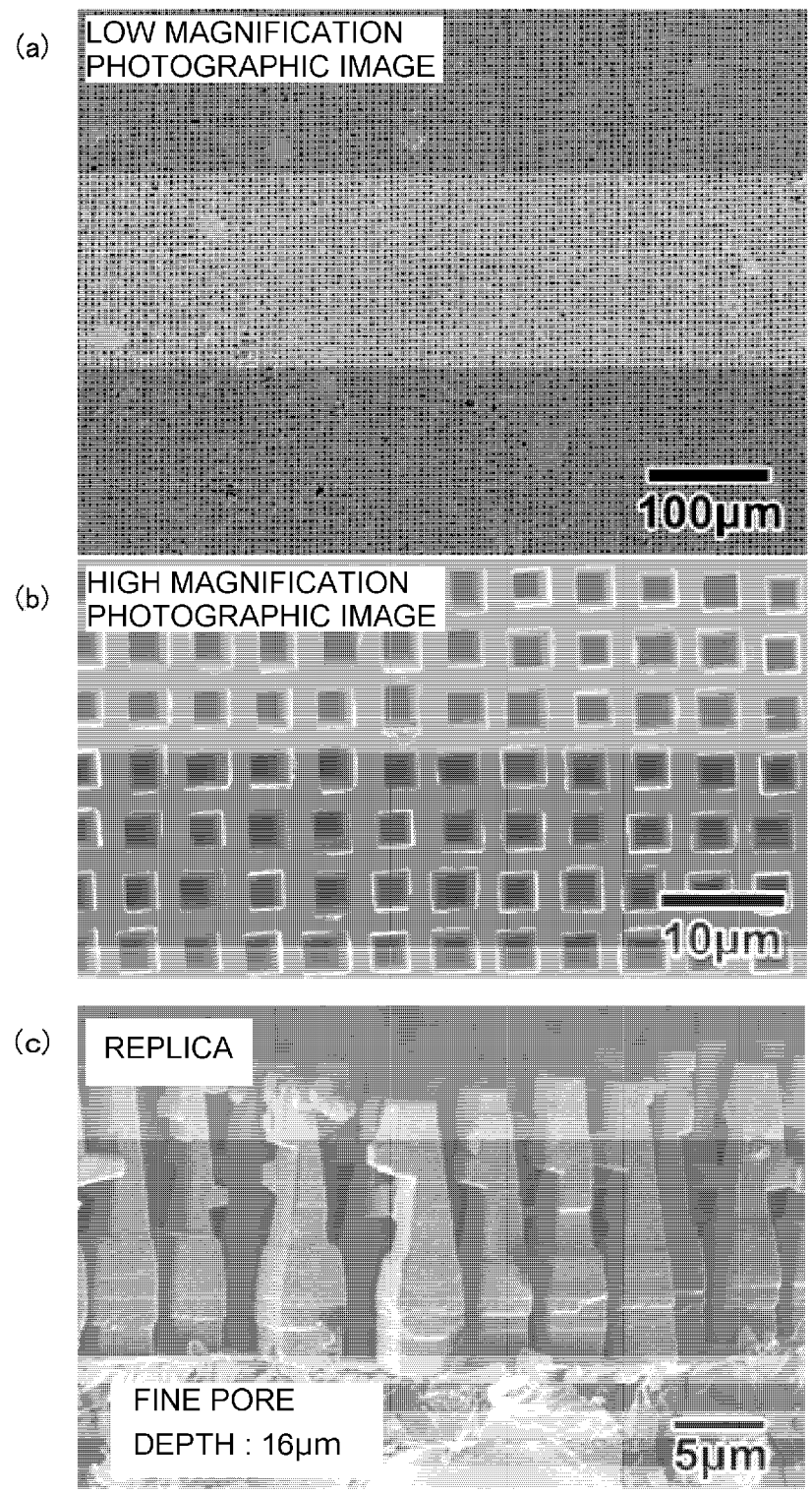
FIG. 6 shows electron microscope photographs of a wavelength selective heat radiation material obtained under optimal electrolysis conditions in the method according to the present invention for manufacturing the wavelength selective heat radiation material.
Figure 7:
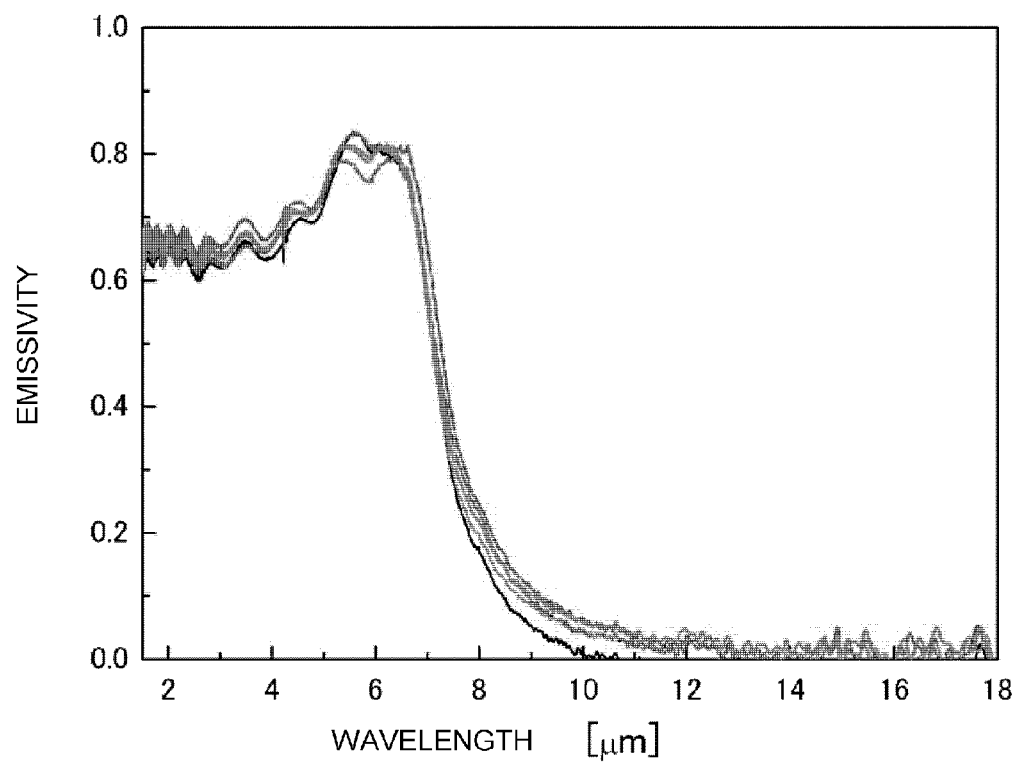
FIG. 7 is a characteristic curve graph showing a relationship between a wavelength and a spectral emissivity of the wavelength selective heat radiation material obtained under the optimal conditions in the method according to the present invention for manufacturing the wavelength selective heat radiation material.

Electron microscope photographs of the obtained wavelength selective heat radiation material is shown in FIG. 6. FIGS. 6A and 6B show the electron microscope photographs of a heat radiation surface of the wavelength selective heat radiation material, whose magnifications are different from each other, and FIG. 6C shows the electron microscope photograph of a replica of the heat radiation surface of the obtained wavelength selective heat radiation material for measuring an opening depth of each of the formed microcavities. In addition, a relationship between a wavelength and a spectral emissivity of the wavelength selective heat radiation material in Example 14, obtained by conducting the measurements at a plurality of times (5 portions) using a Fourier transform infrared spectrophotometer (FT/IR-4100, manufactured by JASCO) and a regular reflection unit (RF-81S, manufactured by JASCO), is shown in FIG. 7. The measurements were conducted under the conditions that a detector was TGS, a resolution was 4 cm$^{-1}$, a number of times of integration was 32, and a measurement band was 550 cm$^{-1}$ to 7800 cm$^{-1}$.

It was found out from FIG. 6 that by previously causing the mask having the predetermined openings to tightly adhere to the one surface and conducting the anisotropic electrolytic etching, it was made possible to form, in a heat radiation surface of the wavelength selective heat radiation material, microcavities each having a length a of one side of 3 µm, a depth d of 16 µm, an opening ratio a/Λ of 0.6, an aspect ratio of 16/3, and a surface roughness Rz of an upper portion of a cavity wall being suppressed to be 1 µm or less. In addition, it was found out from FIG. 7 that the obtained wavelength selective heat radiation material had a small variation in the relationship between the wavelength and the spectral emissivity, exhibited excellent wavelength selectivity in a wavelength range of 7 µm or more, and had a peak of the emissivity around a wavelength of 6 µm.

Next, in order to control the opening depth d of each of the microcavities, experiments relating to the influence exerted on the opening depth d of each of the microcavities by an electrolysis time were conducted.

Examples 15 to 18

An aluminum foil whose area occupancy ratio of a (100) crystal plane of a surface was 93% or more was used, said aluminum foil was subjected to electrolytic polishing by using a perchloric acid/ethanol bath, and thereafter, a neoprene thin film layer having a structure in which fine pores each having a size of 2 µm were regularly arrayed at intervals of 5 µm was caused to tightly adhere to the surface thereof for formation. Copper was attached to said aluminum foil by conducting a sputtering process; thereafter, by using an electrolytic bath having a bath temperature of 40° C. and containing a 7M hydrochloric acid aqueous solution, by using a carbon plate as a counter electrode, by setting a constant current of 1500 mA/cm$^2$ (constant current density), and by changing the electrolysis time to be 0.5, 3.0, 5.0, and 10 seconds, electrolytic etching was conducted. Thereafter, the resultant was immersed in a 1 wt % aqueous solution of a sodium hydroxide; ultrasonic cleaning was conducted for 1 minute and 30 seconds; and the neoprene thin film layer was thereby removed, thereby forming an orthogonal regular array of microcavities in each of Examples 15 to 18.

Figure 8:
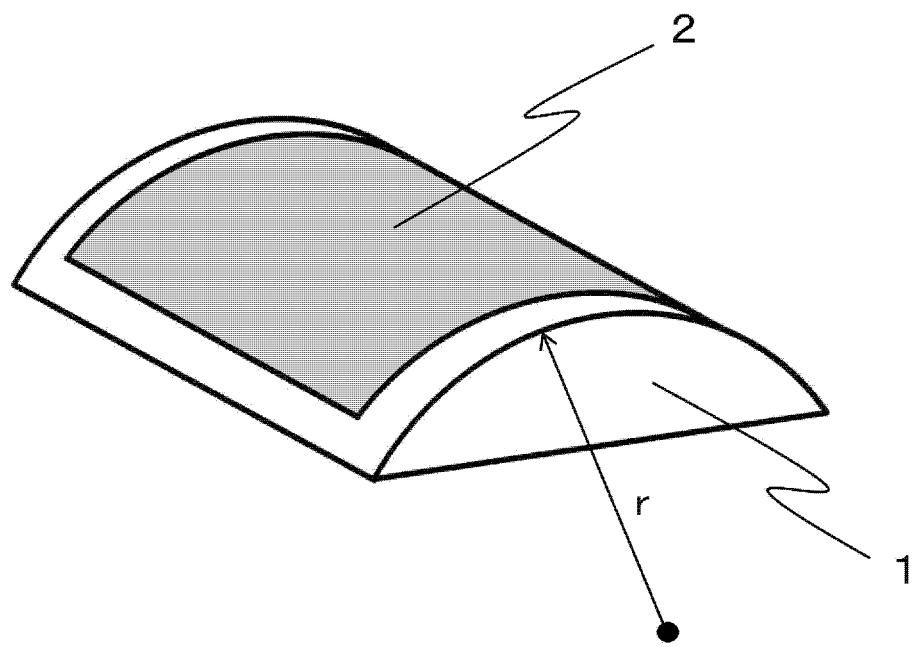
FIG. 8 is a schematic diagram illustrating an outline of a stamp used in the transcription of a mask.

The adhesion of the neoprene thin film layer onto the surface of the aluminum foil was conducted by using a semi-cylindrical-shaped stamp 1 having a pressing surface 2 whose curvature was 0.01 to 0.2 as shown in FIG. 8 and pressing the stamp 1 thereagainst with a load of 10$^4$ to 10$^6$ Pa while swinging were being conducted. As a result, it was made possible to cause the neoprene thin film layer to accurately and firmly adhere tightly thereto with no air entering between the neoprene thin film layer and the surface of the aluminum foil. The opening depths d of the microcavities in the obtained Examples 15 to 18 are shown in Table 1.

TABLE 1

| | Example No. (Electrolysis time) | | | |
|---|---|---|---|---|
| | Example 15 (0.5 second) | Example 16 (3.0 seconds) | Example 17 (5.0 seconds) | Example 18 (10 seconds) |
| Opening depth: d | 1.0 μm | 2.5 μm | 5.4 μm | 9.0 μm |

Figure 9:
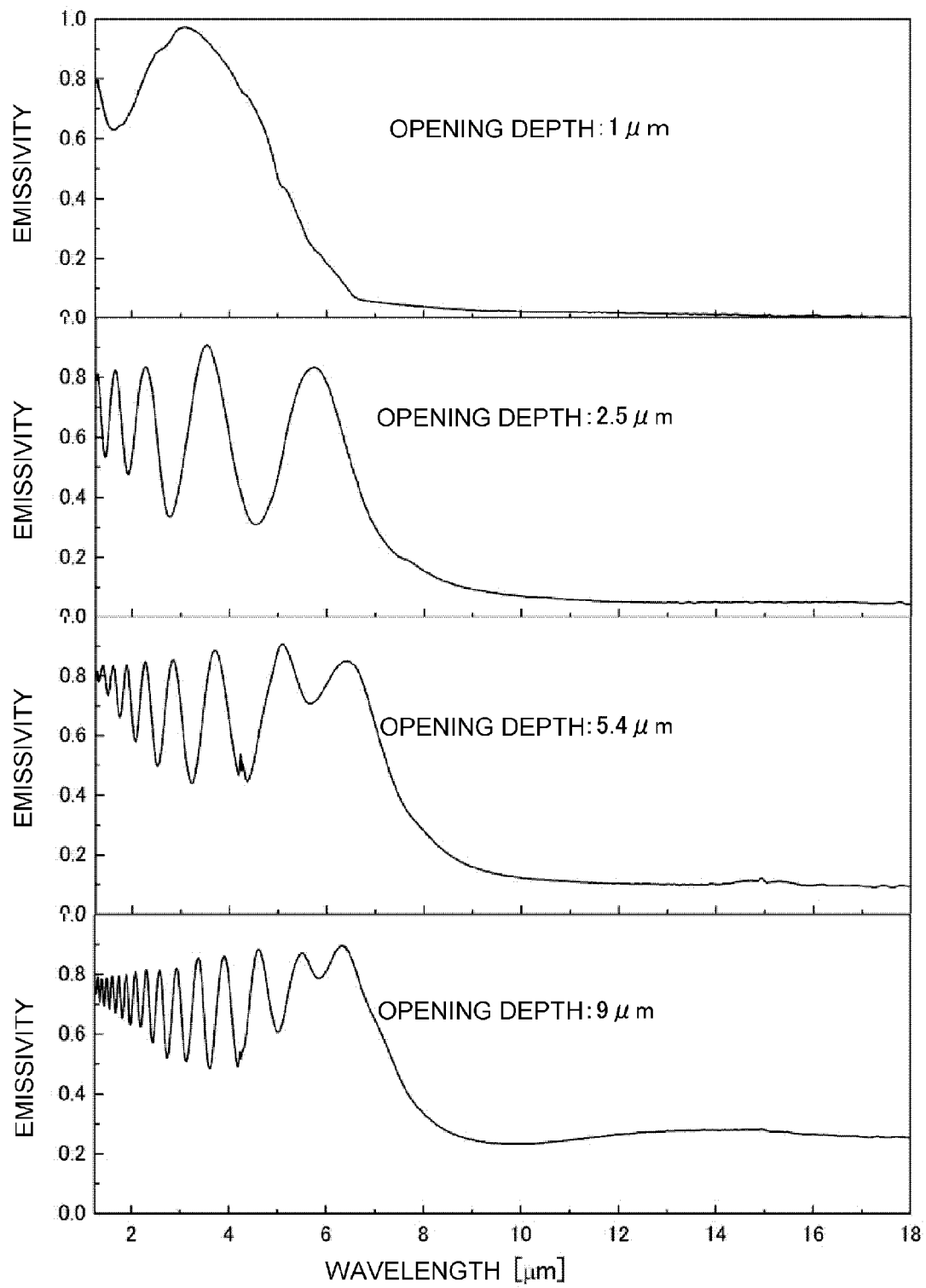
FIG. 9 are characteristic curve graphs, each showing a relationship between a wavelength and a spectral emissivity of a wavelength selective heat radiation material, in cases where depths of each microcavity are different from one another.

A relationship between a wavelength and a spectral emissivity of each of the wavelength selective heat radiation materials in Examples 15 to 18, obtained by conducting the measurements using a Fourier transform infrared spectrophotometer (FT/IR-4100, manufactured by JASCO) and a regular reflection unit (RF-81S, manufactured by JASCO), is shown in FIG. 9. The measurements were conducted under the conditions that a detector was TGS, a resolution was 4 $cm^{-1}$, a number of times of integration was 32, and a measurement band was 550 $cm^{-1}$ to 7800 $cm^{-1}$.

It was confirmed from Table 1 that the opening depth d of each of the microcavities was deepened substantially in proportion to the electrolysis time. In addition, it was found out from FIG. 9 that the characteristic of the wavelength selective heat radiation material varied depending on the opening depth d of each of the microcavities and in each of Examples 17 and 18 whose opening depths d were 5.4 μm and 9.0 μm, respectively, each of the wavelength selective heat radiation materials exhibited excellent wavelength selectivity in a wavelength range of 7 μm or more in particular and had a peak of the emissivity around a wavelength of 6 μm.

Next, in order to control the opening size a of each of the microcavities, experiments relating to the influence exerted on the opening size a of each of the microcavities by the bath temperature of the electrolytic bath were conducted.

Examples 19 to 23

An aluminum foil whose area occupancy ratio of a (100) crystal plane of a surface was 93% or more was used, said aluminum foil was subjected to electrolytic polishing by using a perchloric acid/ethanol bath, and thereafter, a neoprene thin film layer having a structure in which fine pores each having a size of 2 μm were regularly arrayed at intervals of 5 μm was caused to tightly adhere to the surface thereof for formation. Copper was attached to said aluminum foil by conducting a sputtering process; thereafter, under the condition that an electrolysis time was 3 seconds, by using an electrolytic bath containing a 7M hydrochloric acid aqueous solution, by using a carbon plate as a counter electrode, by setting a constant current of 1500 $mA/cm^2$ (constant current density), and by changing the bath temperature to be 30° C. 35° C., 40° C., 45° C. and 50° C., electrolytic etching was conducted. Thereafter, the resultant was immersed in a 1 wt % aqueous solution of a sodium hydroxide; ultrasonic cleaning was conducted for 1 minute and 30 seconds; and the neoprene thin film layer was thereby removed, thereby forming an orthogonal regular array of microcavities in each of Examples 19 to 23.

The adhesion of the neoprene thin film layer onto the surface of the aluminum foil was conducted by using a semi-cylindrical-shaped stamp 1 having a pressing surface 2 whose curvature was 0.01 to 0.2 as shown in FIG. 8 and pressing the stamp 1 thereagainst with a load of $10^4$ to $10^6$ Pa while swinging were being conducted. As a result, it was made possible to cause the neoprene thin film layer to accurately and firmly adhere tightly thereto with no air entering between the neoprene thin film layer and the surface of the aluminum foil. The opening sizes a of the microcavities in the obtained Examples 19 to 23 are shown in Table 2.

TABLE 2

| | Example No. (Bath temperature) | | | | |
|---|---|---|---|---|---|
| | Example 19 (30° C.) | Example 20 (35° C.) | Example 21 (40° C.) | Example 22 (45° C.) | Example 23 (50° C.) |
| Opening size: a | 3.6 μm | 3.2 μm | 3.0 μm | 2.7 μm | 2.5 μm |

Figure 10:
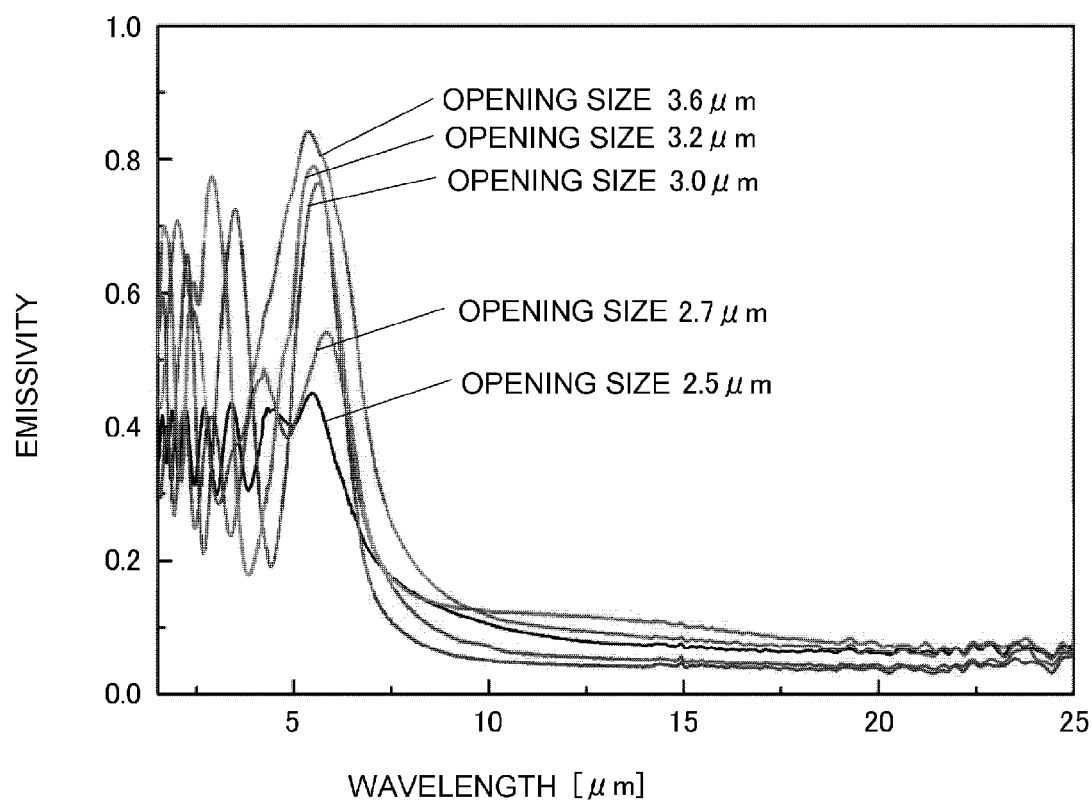
FIG. 10 is a characteristic curve graph showing a relationship between a wavelength and a spectral emissivity, in a case where opening sizes of each microcavity are different from one another.

A relationship between a wavelength and a spectral emissivity of each of the wavelength selective heat radiation materials in Examples 19 to 23, obtained by conducting the measurements using a Fourier transform infrared spectrophotometer (FT/IR-4100, manufactured by JASCO) and a regular reflection unit (RF-81S, manufactured by JASCO), is shown in FIG. 10. The measurements were conducted under the conditions that a detector was TGS, a resolution was 4 $cm^{-1}$, a number of times of integration was 32, and a measurement band was 550 $cm^{-1}$ to 7800 $cm^{-1}$.

It was confirmed from Table 2 that the opening size a of each of the microcavities was narrowed substantially in proportion to the bath temperature. In addition, it was found out from FIG. 10 that the characteristic of the wavelength selective heat radiation material varied depending on the opening size a of each of the microcavities and in each of Examples 19, 20, and 21 whose opening sizes a were 3.6 μm, 3.2 μm, and 3.0 μm, respectively, each of the wavelength selective heat radiation materials exhibited excellent wavelength selectivity in a wavelength range of 7 μm or more in particular and had a peak of the emissivity around a wavelength of 6 μm.

For the wavelength selective heat radiation material according to the present invention, in order to simulate heat radiation characteristics of the wavelength selective heat radiation material in which a surface roughness of an upper portion of a cavity wall defining each microcavity (a size of the chipped portion or the thin-walled portion of the upper portion of the cavity wall) was suppressed and in which microcavities each having an aspect ratio larger than 3.0 were formed, a numerical analysis based on a method was performed. The outline of the numerical analysis based on the RCWA method as follows.

Numerical Analysis

The phenomenon in which wavelength selective absorption characteristics are obtained by a periodic surface fine structure has been explained with reference to the absorption by the surface plasmon induced by the periodic structure, the absorption of the standing wave mode by the cavity structure, or the like. However, since it is the complicated phenomenon to which material properties also are related, quantitative explanations have not been made and it is difficult to evaluate the characteristics in an analytical manner.

Analytical Model

Therefore, by using the RCWA method which was a strict solution method for Maxwell's equations, the present inventors et al. determined an optimal form model of the microcavity periodic structure. The optimal form model was a structure in which rectangular microcavities each having an opening size a and a depth d were two-dimensionally arrayed in a vertical and horizontal manner at a period Λ. These microcavities were formed on one side of an aluminum foil.

Calculation Conditions

The numerical analysis based on the RCWA method was conducted by using the analytical model having the above-mentioned structure, and the simulation evaluation of optical characteristics of the material having a submicron periodic structure on the surface thereof was performed. For the calculation, commercially available simulation software (DiffractMod, RSOFT Inc.) was used. In the RCWA method, since a permittivity distribution of the material is expressed with the Fourier expansion into series, any periodic structure can be analyzed. A geometry and an optical constant (complex index of refraction) are inputted and the Maxwell's equations are strictly solved, thereby allowing a response of an incident wave to be obtained. The RCWA method is a method for analyzing a general three-dimensional diffraction grating problem. The permittivity distribution in a fine structure region is expressed with the Fourier expansion. An analysis accuracy depends on the number of spatial harmonic expansion terms of an electromagnetic field. In the present invention, the analysis was performed with the number of harmonic expansion terms which was 8.

In consideration of up to the eighth order of diffraction, a diffraction efficiency for each order of diffraction was calculated with respect to each wavelength. In the input data, only conditions of an incident wave, a structural profile, and states of optical constants (n, k) of the material were included, and no variable parameters were used in the calculation. The diffraction efficiency for each order of diffraction was calculated by using the optical constants of Al at room temperature, reported in "Handbook of Optical Constants of Solids, E. D. Palik, ed. (Academic Press, Orlando, 1985), p 369-383".

Figure 11:
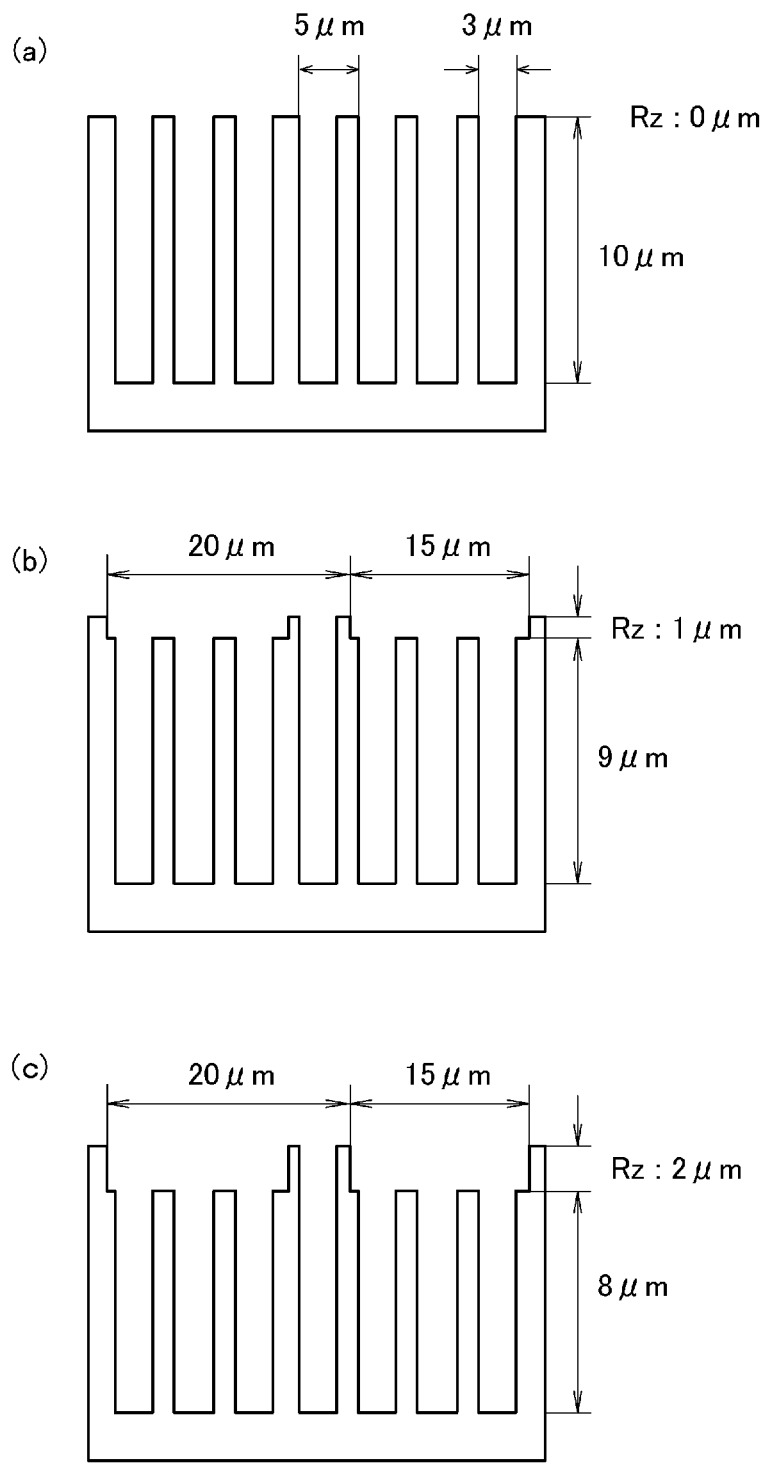
FIG. 11 are schematic diagrams each illustrating a wavelength selective heat radiation material, in a case where a surface roughness Rz of an upper portion of a cavity wall is changed.

With respect to the influence exerted on the spectral emission characteristics in a case where the surface roughness Rz of the upper portion of the cavity wall was changed, as in a schematic diagram shown in FIG. 11, the simulation was performed by setting as a basic form a rectangular microcavity in which a length a of one side was 3 μm, an opening period Λ was 5 μm, a depth d of each of the openings was 10 μm, an opening ratio a/Λ was 0.6, and an aspect ratio d/a was 3.3 and by changing the surface roughness Rz of the upper portion of the cavity wall to (1) 0 μm, (2) 1 μm, and (3) 2 μm.

Calculation Results 1

Figure 12:
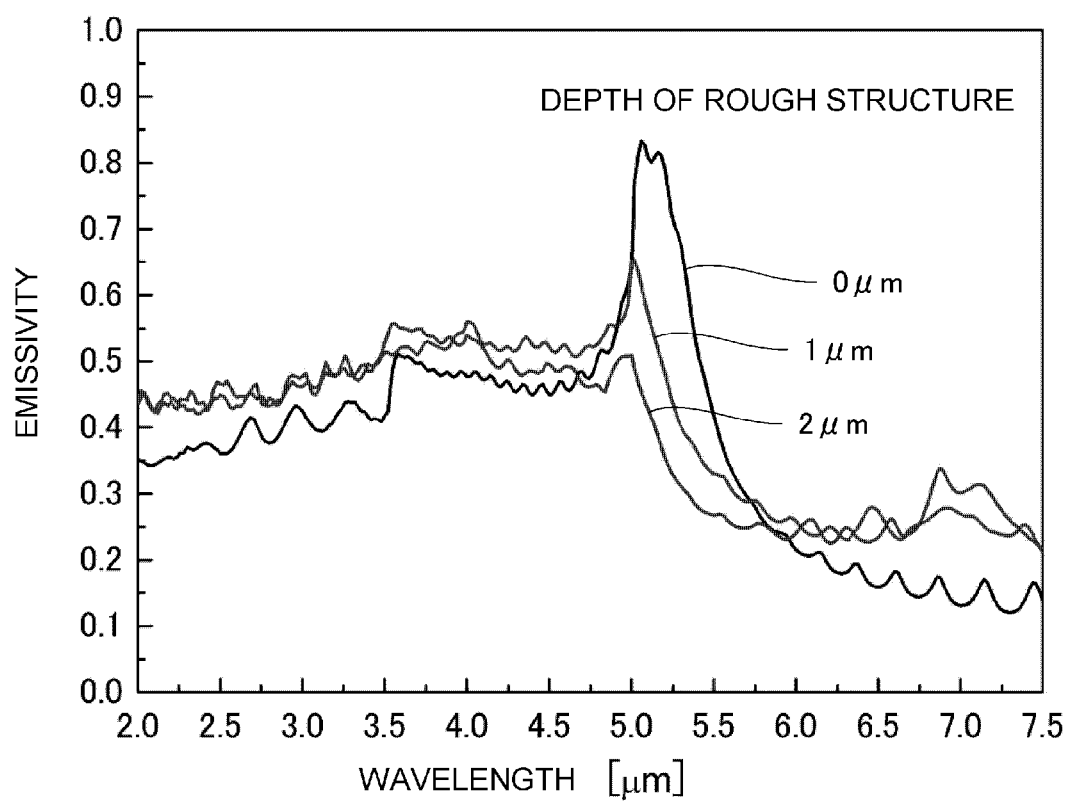
FIG. 12 is a characteristic curve graph showing a relationship between a wavelength and a spectral emissivity of a wavelength selective heat radiation material, obtained by conducting a numerical analysis with respect to an analytical model, in case where the surface roughness Rz of the upper portion of the cavity wall is changed.

FIG. 12 is a spectral emission characteristic curve graph showing the results of the numerical analysis for the structure model shown in FIG. 11, performed in the RCWA method, with a horizontal axis showing a wavelength λ (μm) and a vertical axis showing a spectral emissivity.

When the surface roughness Rz of the upper portion of the cavity wall defining each of the microcavities became larger than 1 μm, a peak of the spectral emissivity in a wavelength range of 4.75 to 5.75 μm in particular was reduced, and therefore, it was difficult to selectively radiate heat radiation light included in an infrared ray transmission wavelength region of a resin member. As a result, it was found out that the surface roughness Rz of the upper portion of the cavity wall defining each of the microcavities was suppressed to be 1 μm or less, thereby allowing the microcavity periodic structure to obtain spectral selectivity suitable for the heat radiation to substantially make the resin member transparent to the infrared light.

Figure 13:
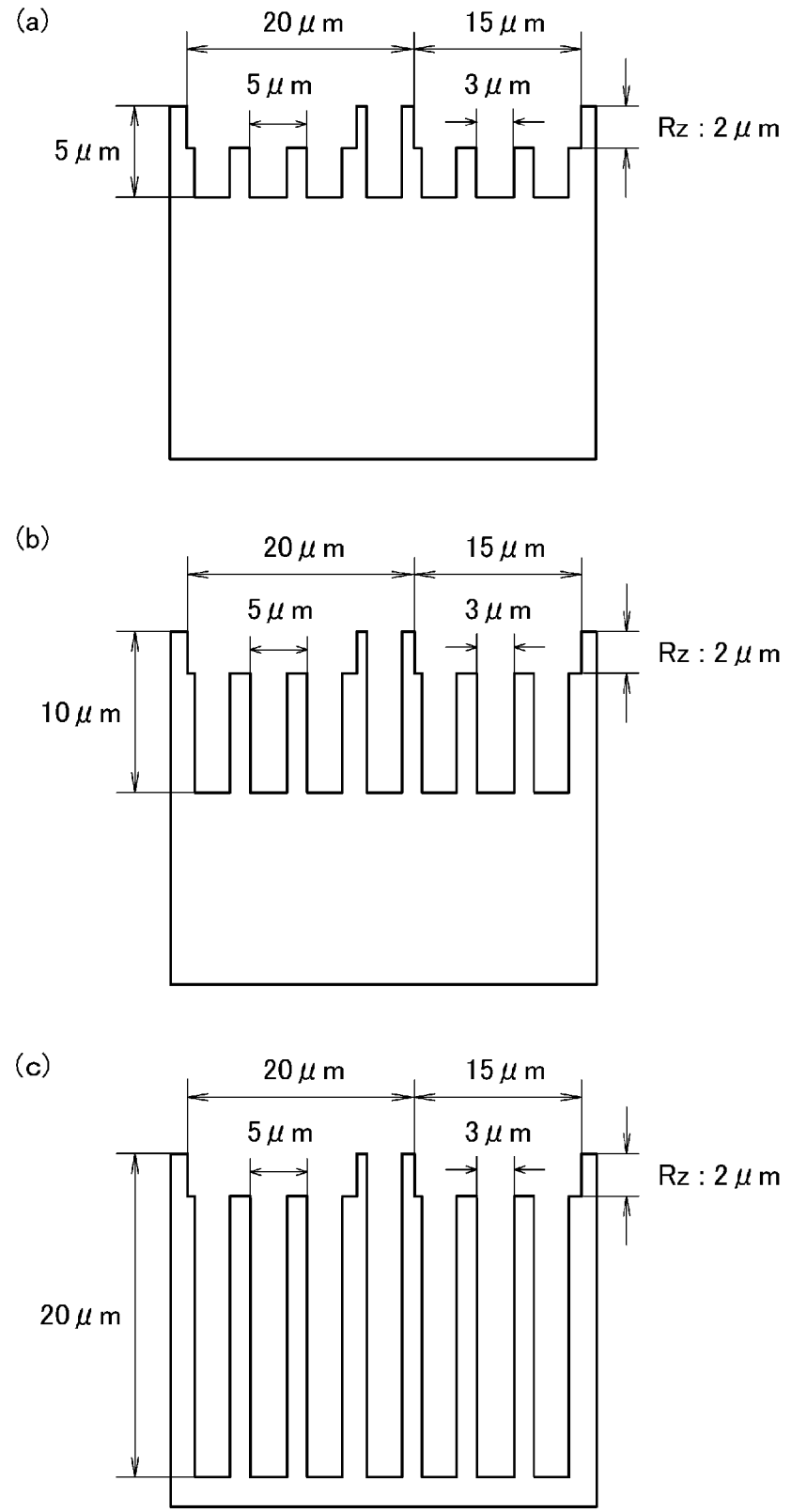
FIG. 13 are schematic diagrams each illustrating a wavelength selective heat radiation material, in a case where a depth of each microcavity having a surface roughness Rz of an upper portion of a cavity wall, which is 2 μm, is changed.

With respect to the influence exerted on the spectral emission characteristics in a case where the depth of each of the microcavities having the surface roughness Rz of the upper portion of the cavity wall of 2 μm was changed, as in a schematic diagram shown in FIG. 13, the simulation was performed by setting as a basic form a rectangular microcavity in which a length a of one side was 3 μm, an opening period Λ was 5 μm, the surface roughness Rz was 2 μm, and an opening ratio a/Λ was 0.6 and by changing the depth d to (1) 5 μm (aspect ratio d/a: 1.7), (2) 10 μm (aspect ratio d/a: 3.3), and (3) 20 μm (aspect ratio d/a: 6.7).

Calculation Results 2

Figure 14:
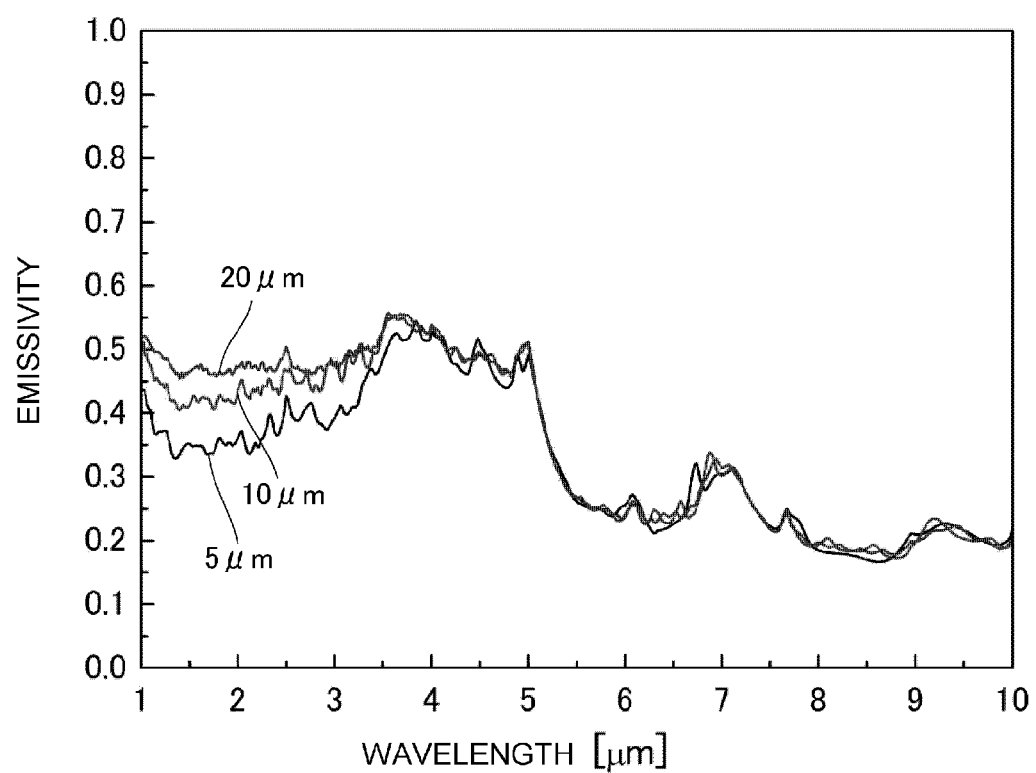
FIG. 14 is a characteristic curve graph showing a relationship between a wavelength and a spectral emissivity of a wavelength selective heat radiation material, obtained by conducting a numerical analysis with respect to the analytical model, in case where the depth of each microcavity having the surface roughness Rz of the upper portion of the cavity wall, which is 2 μm, is changed.

FIG. 14 is a spectral emission characteristic curve graph showing the results of the numerical analysis for the structure model shown in FIG. 13, performed in the RCWA method, with a horizontal axis showing a wavelength λ (μm) and a vertical axis showing a spectral emissivity.

When the surface roughness Rz of the upper portion of the cavity wall defining each of the microcavities became larger than 1 μm, regardless of the depth d of the opening of each of the microcavities, a spectral emissivity in a wavelength range of 1 to 10 μm was reduced, and a peak of the spectral emissivity in a wavelength range of 3 to 5.5 μm in particular was reduced, and therefore, it was difficult to selectively radiate the heat radiation light included in the infrared ray transmission wavelength region of the resin member. As a result, it was found out that the surface roughness Rz of the upper portion of the cavity wall defining each of the microcavities was suppressed to be 1 μm or less, thereby allowing the microcavity periodic structure to obtain the spectral selectivity suitable for the heat radiation to substantially make the resin member transparent to the infrared light, regardless of the depth d of the opening of each of the microcavities.

Figure 15:
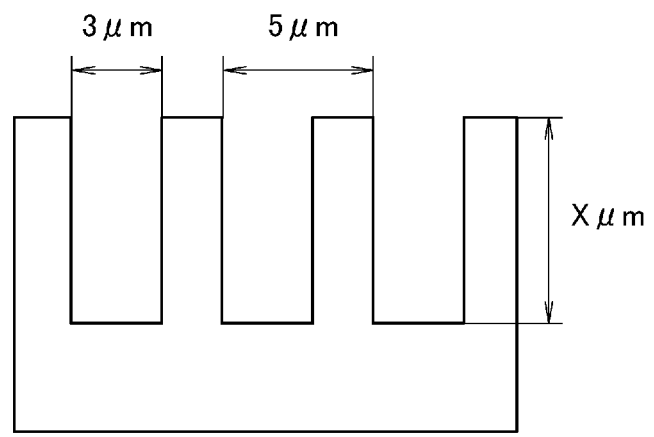
FIG. 15 is a schematic diagram illustrating a wavelength selective heat radiation material in a case where the depth of each microcavity is changed.

With respect to the influence exerted on the spectral emission characteristics in a case where the depth of each of the microcavities was changed, as in a schematic diagram shown in FIG. 15, the simulation was performed by setting as a basic form a rectangular microcavity in which a length a of one side was 3 μm, an opening period Λ was 5 μm, and an opening ratio a/Λ was 0.6 and by changing the depth d to (1) 2 μm (aspect ratio d/a: 0.7), (2) 4 μm (aspect ratio d/a: 1.3), (3) 7.5 μm (aspect ratio d/a: 2.5), (4) 15 μm (aspect ratio d/a: 5.0), and (5) 32 μm (aspect ratio d/a: 0.7).

Calculation Results 3

Figure 16:
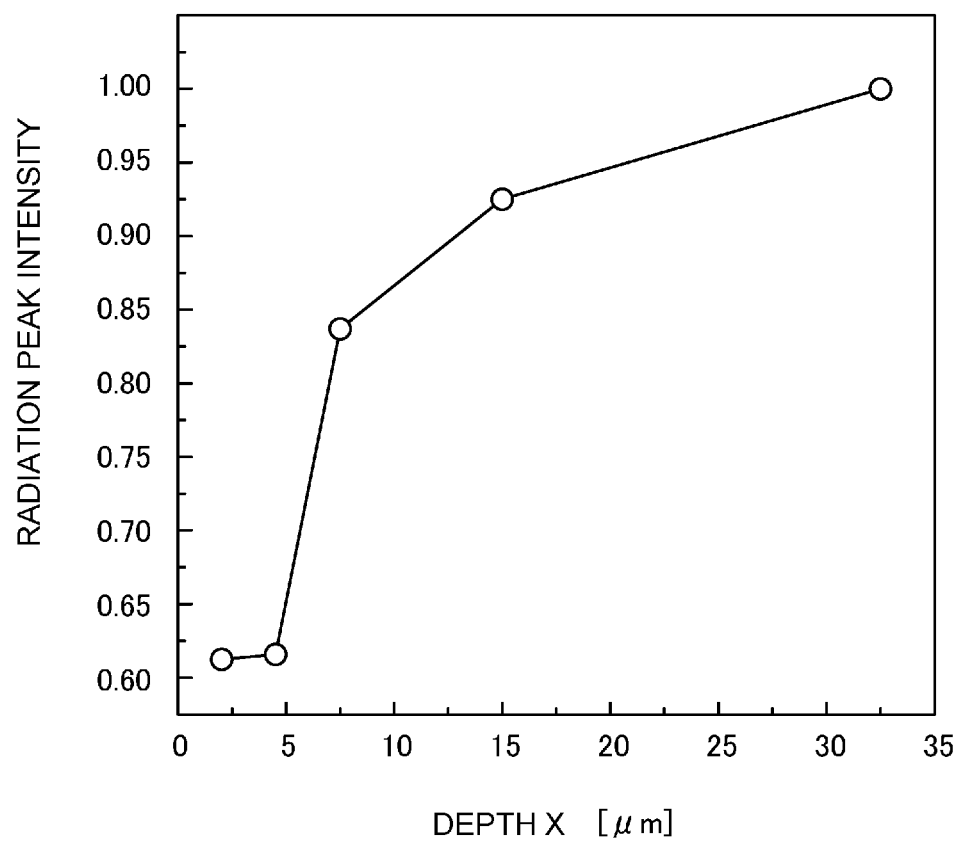
FIG. 16 is a characteristic curve graph showing a relationship between a wavelength and a spectral emissivity of a wavelength selective heat radiation material, obtained conducting a numerical analysis with respect to the analytical model, in a case where the depth of each microcavity is changed.

FIG. 16 is a spectral emission characteristic curve graph showing the results of the numerical analysis for the structure model shown in FIG. 15, performed in the RCWA method, with a horizontal axis showing a wavelength λ (μm) and a vertical axis showing a spectral emissivity.

In a region in which an aspect ratio d/a (d: opening depth, a: opening size) of each of the microcavities was less than 3.3, in accordance with an increase in the aspect ratio d/a, an emissivity of the heat radiation light corresponding to the infrared ray transmission wavelength region of the resin member was sharply increased up to approximately 0.85, whereas in a region in which the aspect ratio d/a was 3.3 or more, with respect to a rate of an increase in the aspect ratio d/a, a rate of an increase in the emissivity of heat radiation light corresponding to the infrared ray transmission wavelength region of the resin member was sharply decreased and nearly leveled off in a range of 0.85 to 1.0. As a result, it was found out that the aspect ratio d/a of each of the microcavities was set to 3.3 or more, thereby allowing the wavelength selective heat radiation material exhibiting the high emissivity of 0.85 or more to the heat radiation light to be obtained, to substantially make the resin member transparent to the infrared light.

REFERENCE SIGNS LIST 1 stamp
2 pressing surface
r curvature radius

The invention claimed is:

1. A wavelength selective heat radiation material for selectively radiating heat radiation light corresponding to an infrared ray transmission wavelength region of a resin member, said wavelength selective heat radiation material comprising:
   a base material having a heat radiation surface, said heat radiation surface having a multitude of microcavities formed therein, the microcavities having rectangular openings being periodically repeated and being two-dimensionally arrayed in a grating-like manner, and
   the microcavities each having an opening ratio a/Λ, wherein a is opening size in µm and Λ is opening period, in a range of 0.5 to 0.9, each having an aspect ratio d/a, wherein d is opening depth in µm and a is opening size in µm, of 3.3 or more, and each having 1 µm or less of a surface roughness Rz of an upper portion of a cavity wall defining each of the microcavities,
   wherein said wavelength selective heat radiation material selectively radiates heat radiation light corresponding to an infrared ray transmission wavelength region of a resin member.

2. The wavelength selective heat radiation material according to claim 1, wherein said openings are each arrayed at the substantially same period as a period of a wavelength in the infrared ray transmission wavelength region of the resin member or at a period that is shorter by 1 µm than the period of the wavelength in the infrared ray transmission wavelength region of the resin member.

3. The wavelength selective heat radiation material according to claim 1, wherein said the openings are each arrayed at a period of 4 to 7 µm.

4. The wavelength selective heat radiation material according to claim 1, wherein said base material comprises a metal material whose emissivity in an infrared region of a wavelength of 1 to 10 µm is 0.4 or less.

5. The wavelength selective heat radiation material according to claim 1, wherein said base material comprises aluminum or an aluminum alloy whose area occupancy ratio of a (100) crystal plane is 93% or more.

6. The wavelength selective heat radiation material according to claim 1, wherein the heat radiation light selectively radiated by said material is infrared light.

7. An assembly comprising, a resin member, a heat generation source, and said wavelength selective heat radiation material according to claim 1, wherein said resin member covers said heat generation source, and said wavelength selective heat radiation material is positioned between said heat generation source and said resin member.

8. The wavelength selective heat radiation material according to claim 1, wherein said base material comprises a metal foil.

9. A method for manufacturing the wavelength selective heat radiation material according to claim 8, said method comprising:
   (a) placing a mask having predetermined openings on one surface of the metal foil and causing the mask to tightly adhere to the one surface;
   (b) etching the metal foil at the openings of the mask and forming said microcavities in the metal foil; and
   (c) exfoliating the mask from the metal foil.

10. The method according to claim 9, wherein the mask comprises a flexible polymer.

11. The method according to claim 9, wherein a load is exerted on a surface of the mask by pressing a stamp having a semi-cylindrical-shaped pressing surface against the surface of the mask.

12. The method according to claim 11, wherein the pressing surface of the stamp has a curvature of 0.01 to 0.2.

13. The method according to claim 11, wherein the load exerted on the mask is $10^4$ to $10^6$ Pa.

14. The method according to claim 9, further comprising forming a thin film of copper on an upper surface of the mask by evaporation or sputtering, prior to the etching.

15. A method for manufacturing the wavelength selective heat radiation material according to claim 8, said method comprising:
   (a) forming depressions in one surface of the metal foil by pressing a die having projections against the one surface, the projections being arrayed so as to correspond to positions of said microcavities; and
   (b) etching the metal foil to form the microcavities in the metal foil.

16. The method according to claim 9, further comprising subjecting the metal foil to a chemical polishing process or an electrolytic polishing process, prior to causing the mask having the predetermined openings to tightly adhere to the one surface of the metal foil or prior to forming the depressions in the one surface of the metal foil.

17. The method according to claim 16, wherein the metal foil is subjected to electrolytic polishing process which is conducted by using a mixed solution of perchloric acid and ethanol.

18. The method according to claim 9, wherein the etching is electrolytic etching.

19. The method according to claim 18, wherein the electrolytic etching is conducted using an electrolytic bath whose bath composition is a 5M to 7M hydrochloric acid aqueous solution and whose bath temperature is 25° C. to 45° C.; and
   wherein the current density upon starting electrolysis is 1500 mA/cm$^2$; and, after decreasing the current density at a current density decrease rate of 150 mA/cm$^2$/s to 200 mA/cm$^2$, the current density of 200 mA/cm$^2$ is retained for 5 to 40 seconds.

20. The method according to claim 19, wherein said bath temperature is 30° C. to 40° C., and the current density of 200 mA/cm$^2$ is retained for 5 to 15 seconds.

* * * * *